(12) United States Patent
Tomura et al.

(10) Patent No.: US 7,845,954 B2
(45) Date of Patent: Dec. 7, 2010

(54) INTERCONNECTING BOARD AND THREE-DIMENSIONAL WIRING STRUCTURE USING IT

(75) Inventors: Yoshihiro Tomura, Osaka (JP); Yasushi Nakagiri, Kyoto (JP); Kunio Hibino, Osaka (JP); Yoshihiko Yagi, Hyogo (JP); Akihiro Miyashita, Kanagawa (JP); Masahiro Ono, Osaka (JP); Masato Mori, Osaka (JP)

(73) Assignee: Panasonic Corporation, Osaka (JP)

( * ) Notice: Subject to any disclaimer, the term of this patent is extended or adjusted under 35 U.S.C. 154(b) by 246 days.

(21) Appl. No.: 11/995,339

(22) PCT Filed: Apr. 17, 2006

(86) PCT No.: PCT/JP2006/308062
§ 371 (c)(1),
(2), (4) Date: Feb. 5, 2008

(87) PCT Pub. No.: WO2007/007450
PCT Pub. Date: Jan. 18, 2007

(65) Prior Publication Data
US 2008/0139013 A1  Jun. 12, 2008

(30) Foreign Application Priority Data
Jul. 14, 2005 (JP) ............................. 2005-205012

(51) Int. Cl.
*H01R 12/00* (2006.01)
(52) U.S. Cl. .......................................... 439/66; 439/65

(58) Field of Classification Search .................. 439/66, 439/91
See application file for complete search history.

(56) References Cited

U.S. PATENT DOCUMENTS

| | | | | |
|---|---|---|---|---|
| 3,858,154 | A * | 12/1974 | William | 439/66 |
| 3,924,915 | A | 12/1975 | Conrad | 339/14 F |
| 4,752,231 | A * | 6/1988 | Olsson | 439/66 |
| 5,007,841 | A * | 4/1991 | Smolley | 439/66 |
| 5,028,986 | A | 7/1991 | Sugano et al. | 357/75 |
| 5,570,274 | A | 10/1996 | Saito et al. | 361/784 |
| 6,540,525 | B1 * | 4/2003 | Li et al. | 439/66 |
| 7,258,549 | B2 * | 8/2007 | Asahi et al. | 439/66 |

FOREIGN PATENT DOCUMENTS

| | | |
|---|---|---|
| JP | 4-132177 | 5/1992 |
| JP | 7-37631 | 2/1995 |
| JP | 2002-217514 | 8/2002 |

\* cited by examiner

*Primary Examiner*—Briggitte R Hammond
(74) *Attorney, Agent, or Firm*—Steptoe & Johnson LLC

(57) ABSTRACT

A first circuit board (1) mounted with an electronic component (16) and a second circuit board (2) are vertically connected three-dimensionally through an interconnecting board (3) wherein the terminal portion (6) of the land electrode (5) on the interconnecting board (3) is buried in the termination material (9) of the interconnecting board (3). Consequently, the chance of peeling or cracking due to peeling stress or shearing stress acting between the upper/lower circuit boards and the land electrode by high density mounting, thermal shock or falling impact can be suppressed or buffered resulting in high reliability.

8 Claims, 30 Drawing Sheets

FIG. 15
(a)
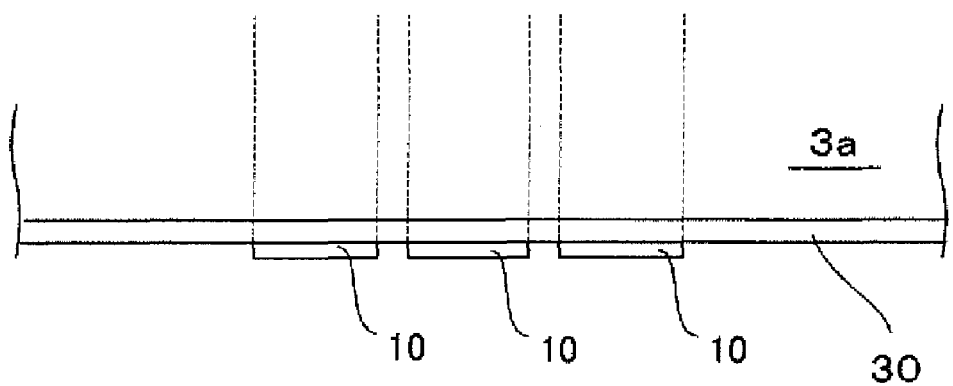
(b)
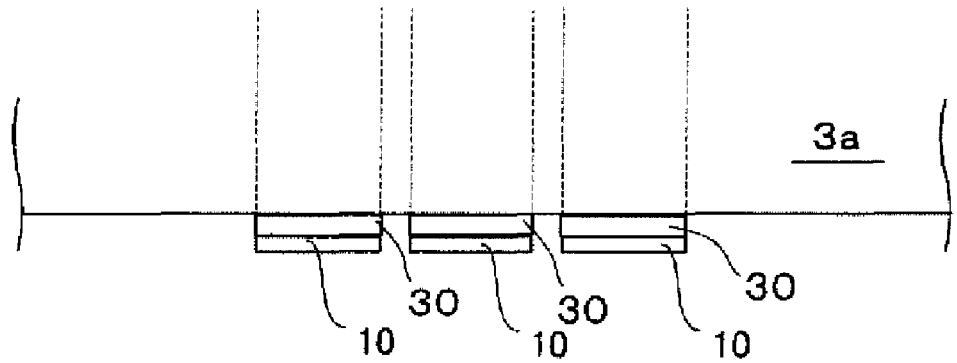

F I G. 1 7
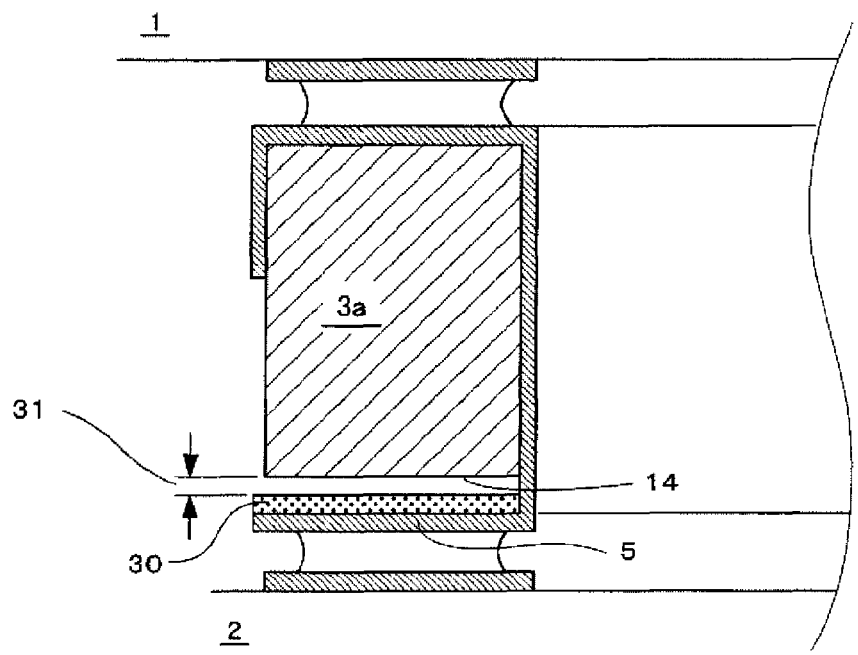
F I G. 1 8
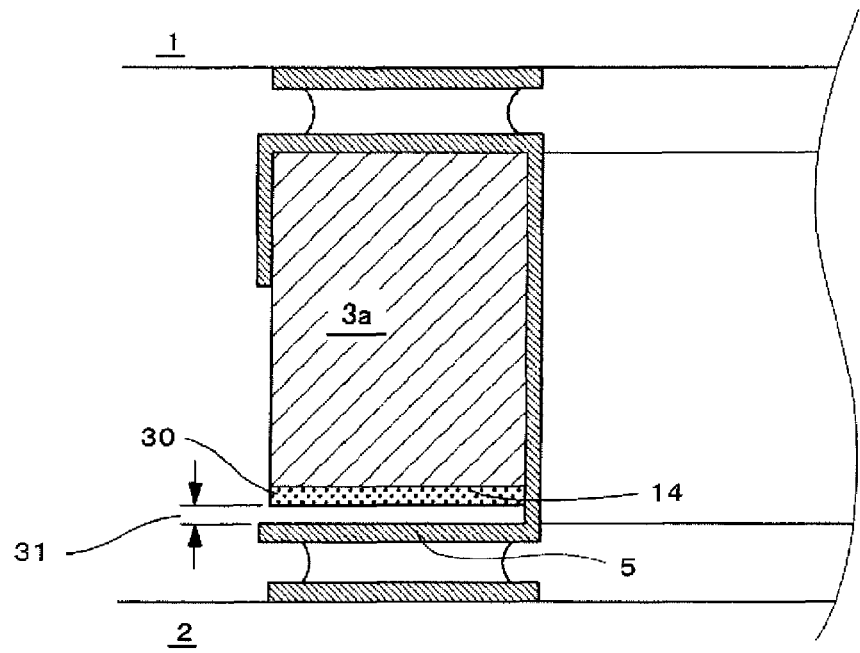

FIG. 28   PRIOR ART
(a)
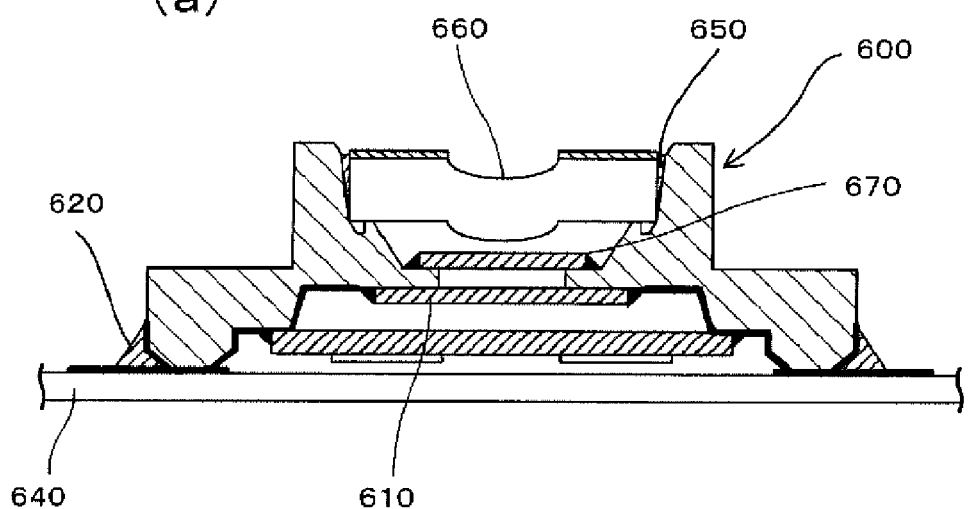
(b)
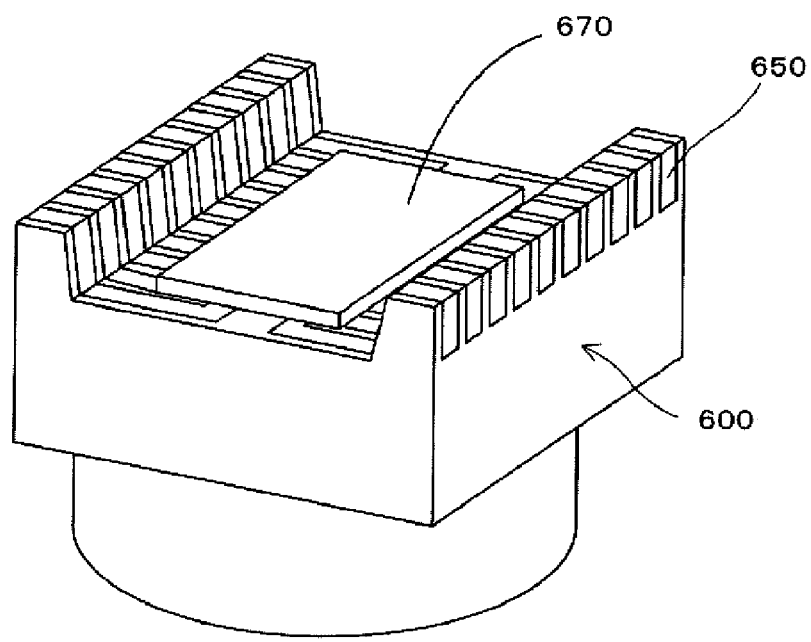

FIG. 29    PRIOR ART
(a)
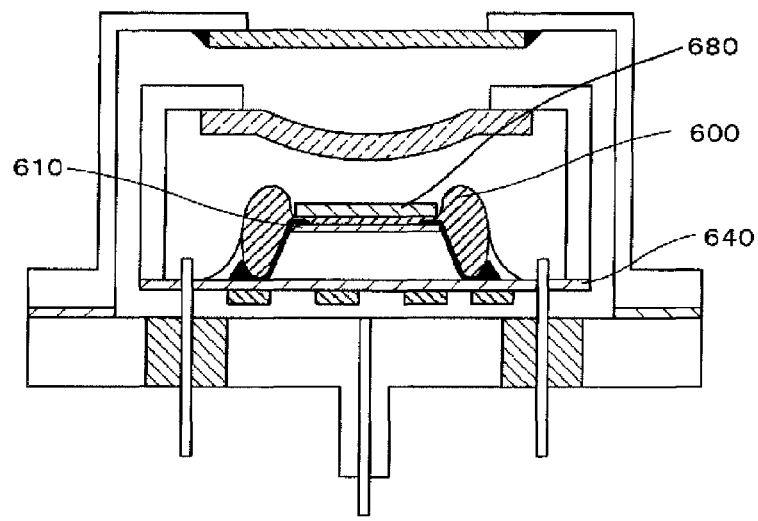
(b)
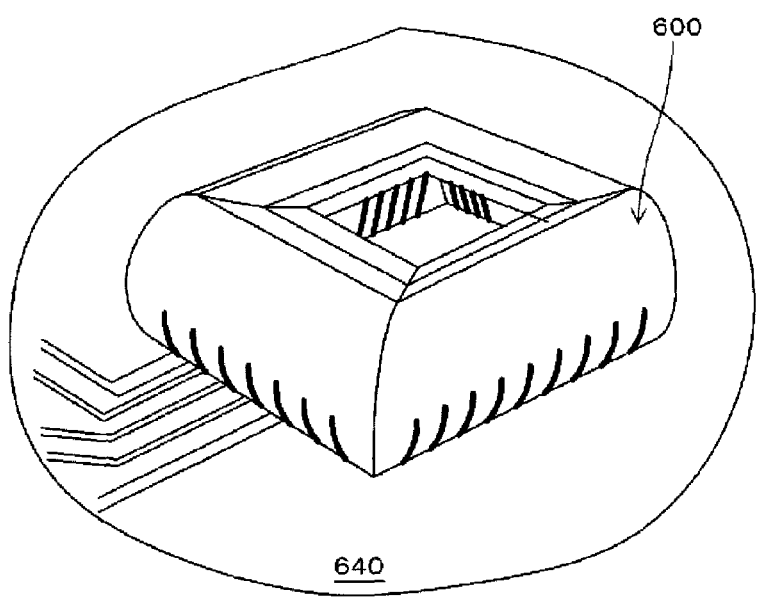
(c)
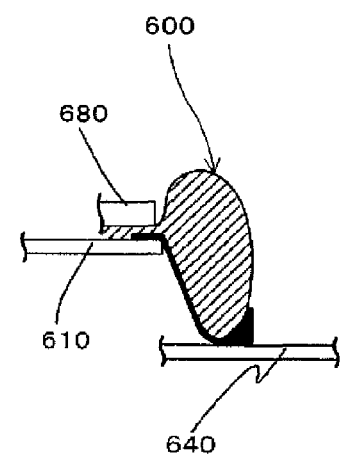

INTERCONNECTING BOARD AND THREE-DIMENSIONAL WIRING STRUCTURE USING IT

The present application is based on International Application PCT/JP2006/308062, filed Apr. 17, 2006, which claims priority to Japanese Patent Application No, 2005-205012, filed Jul. 14, 2005, the entire contents of which are hereby incorporated by reference.

TECHNICAL FIELD

The present invention relates to an interconnecting board that connects a circuit module or the like with an electronic component mounted thereon to a base circuit board for interconnection, as well as a three-dimensional wiring structure using the interconnecting board.

BACKGROUND ART

With the reduced thicknesses and sizes of apparatuses, there has been a strong demand for an increase in the mounting density of electronic circuit devices having an insulating circuit board on which resistors, capacitors, semiconductor elements, and the like are mounted.

For electronic circuit devices of this kind, the component mounting density has been increased by reducing wiring pitch or stacking a plurality of electronic circuit boards together.

For example, an electronic circuit device described in Japanese Patent Laid-Open No. 2001-177235 (Patent Document 1) has a base printed circuit board 310 and a module circuit board 350 stacked on the base printed circuit board 310 via spacers 360 as shown in FIG. 25.

The spacers 360 are temporarily fixed to the upper and lower circuit boards via spherical solders 380 and 390; the spherical solders 380 are electrically connected together through via holes 320, and the spherical solders 390 are electrically connected together through via holes 320. The spacers 360 temporarily fixed between the base printed circuit board 310 and the module circuit board 350 are all subjected to reflow soldering at a time. Reference numeral 330 denotes a surface mounting component mounted on the module circuit board 350. Reference numeral 340 denotes a semiconductor bare chip mounted on the module circuit board 350.

An electronic circuit device described in Japanese Patent Laid-Open No. 2001-267715 (Patent Document 2) has electronic circuit boards 410 and 430 laid on top of each other via a heat-resistant elastic member 400, the outer periphery of which is coated with a conductive substance, as shown in FIG. 26. The heat-resistant elastic member 400 is soldered to a connecting land 420 on the one electronic circuit board 410 and contact-bonded to a connecting land 440 on the other electronic circuit board 430 by a clip, a bolt 470, or the like. Reference numeral 450 denotes a surface mounting component, and reference numeral 460 denotes a semiconductor bare chip.

An electronic circuit device described in Japanese Patent Laid-Open No-6-260736 (Patent Document 3) has a module circuit board 500 mechanically and electrically connected to a mother board 540 via connecting chips 550 as shown in FIG. 27. Reference numeral 510 denotes an IC package, and reference numerals 520 and 530 denote passive components.

An electronic circuit device described in Japanese Patent Laid-Open No. 2001-245186 (Patent Document 4) has a three-dimensional printed circuit board 600 in which a lens 660, an optical filter 670, a semiconductor image pickup element 610 are integrally incorporated on an optical axis of the lens 660 as shown in FIGS. 28A and 28B. The three-dimensional printed circuit board 600 has a wiring pattern 650 that allows the semiconductor image pickup element 610 and a chip component 615 to be connected together. Reference numeral 640 denotes a printed circuit board to which the three-dimensional printed circuit board 600 is soldered for mounting.

An electronic circuit device described in Japanese Patent Laid-Open No. 2000-341566 (Patent Document 5) has the three-dimensional circuit board 600 on which the semiconductor image pickup element 610 and an infrared filter 680 are installed and which is mounted on the circuit-integrated printed circuit board 640 as shown in FIGS. 29A, 29B, and 29C.

Another method uses connectors, which are general connecting components, for junction.

Furthermore, for example, an electronic circuit device described in Japanese Patent Laid-Open No. 6-61415 (Patent Document 6) has a plurality of circuit modules stacked via solder or the like using a terminal 720 projecting from a side surface of a circuit module 710 as shown in FIG. 30. The circuit module 710 has the terminal 720 projecting from the side surface toward a bottom surface of the circuit module. Another circuit module 730 located under the circuit module 710 has a terminal portion 740 projecting from a general side surface so as to form an L shape.

The circuit module 710 and the circuit module 730 are joined together by joining the terminal portion to the L-shaped terminal portion via a joining member such as solder.

An electronic circuit device described in Japanese Utility Model Laid-Open No. 1-134367 (Patent Document 7) has a circuit board 810 and another circuit board 820 which are stacked via anisotropic conductive rubber 830 and connected together using a fastener 840 as shown in FIG. 31.

In spite of continuous efforts to improve the functions of the portable terminal devices and to reduce the thickness and size thereof, two-dimensional electronic circuit devices are limited in improvement of the mounting density based on a reduction in connecting pitch and in the gap between adjacent components. Attempts have thus been made to three-dimensionally stack module circuit boards together to increase the density.

The spacers 360 in (Patent Document 1) and the connecting chip 550 in (Patent Document 3) three-dimensionally connect the module circuit boards together via the conductive vias or via holes 320 that connect the lands formed on the upper surface of the circuit board to the corresponding lands formed on the lower surface of the circuit board.

If the clip 470, the bolt, or the like is used to fix the stacked module circuit boards in (Patent Document 2) together, an area occupied by fixing and connecting members increases to reduce mounting area. Furthermore, the number of connecting terminals between the module circuit boards increases to increase the area of the connectors used to connect module circuit boards together. This disadvantageously prevents the mounting density from being increased by increasing the connecting area between the module circuit boards.

The three-dimensional printed circuit board 600 in (Patent Document 4) and (Patent Document 5) includes the disclosed three-dimensional wiring structure of the image pickup element 610 and is three-dimensionally connected to the printed circuit board 640 via the solder 620. However, the reliability of the connections cannot be improved simply by soldering the wiring pattern 650 on the printed circuit board 640 to the tip portions of the land electrodes 630 on the three-dimensional printed circuit board 600, formed on the surface of the circuit board.

The terminal portion 720 in (Patent Document 6) is three-dimensionally joined to the L-shaped terminal portion 740 via a joining member such as solder. When the fastener (clip) 840 or the like is used to fixedly stack the circuit boards in (Patent Document 7) together, the area and height occupied by the fixing and connecting members increases to reduce the mounting area (volume). Furthermore, the number of connecting terminals between the module circuit boards increases to increase the area of the connectors used to connect the module circuit boards together. This disadvantageously prevents the mounting density from being increased by increasing the connecting area between the module circuit boards.

Further, recent portable devices have been desired to offer durability and reliability against a fall or the like. Thus, the reliability of the connection cannot be improved by making the connections only by solder as in the case of (Patent Document 6).

An object of the present invention is to provide an interconnecting board which solves the conventional problems and which provides dense mounting and improved connection reliability.

DISCLOSURE OF THE INVENTION

The present invention has an interconnecting board main body interposed between a first circuit board and a second circuit board, and circuit board connecting wiring formed in association with electric connection points so as to extend from a first circuit board-side surface of the interconnecting board main body to a second circuit board-side surface of the interconnecting board main body, wherein at least one of a first circuit board-side end of the circuit board connecting wiring and a second circuit board-side end of the circuit board connecting wiring is buried in a termination material.

In the interconnecting board, a recessed portion is formed in at least one of a corner portion extending continuously from a top surface to a side surface portion of the interconnecting board main body and a corner portion extending continuously from a bottom surface to the side surface portion of the interconnecting board main body, the circuit board connecting wiring is formed along the recessed portion, a corner portion processing material is filled into the recessed portion, and a corner portion of the circuit board connecting wiring is buried in the corner portion processing material.

An interconnecting board has an interconnecting board main body interposed between a first circuit board and a second circuit board, and circuit board connecting wiring formed in association with electric connection points so as to extend from a first circuit board-side surface of the interconnecting board main body to a second circuit board-side surface of the interconnecting board main body, wherein the interconnecting board main body has a corner portion extending continuously from a first circuit board-side surface to a side surface portion and a corner portion extending continuously from a second circuit board-side surface to the side surface portion, at least one of the corner portions being formed into an inclined surface including a corrugated curved surface, the ends and corner portion of the circuit board connecting wiring being stuck along the inclined surface including the corrugated curved surface.

A three-dimensional wiring structure includes a first circuit board and a second circuit board three-dimensionally connected together by interposing the interconnecting board between the first circuit board and the second circuit board.

A method of manufacturing a three-dimensional wiring structure according to the present invention includes forming a junction layer on a desired terminal electrode on a first circuit board on which an electronic component and an interconnecting board are to be mounted, aligning and then placing the electronic component and the interconnecting board on the first circuit board with the junction layer formed thereon, executing a thermal process on the first circuit board with the electronic component and the interconnecting board placed thereon to melt or cure the junction layer to electrically join the electronic component and the interconnecting board to the first circuit board, forming a junction layer on a desired terminal electrode on a second circuit board on which an electronic component and the interconnecting board are to be mounted, aligning and then placing the first circuit board with the electronic component and interconnecting board on the second circuit board with the junction layer formed thereon, and executing a thermal process on the second circuit board with the first circuit board with the electronic component and interconnecting board placed thereon to melt or cure the junction layer to electrically join the first circuit board with the electronic component and interconnecting board to the second circuit board.

A method of manufacturing a three-dimensional wiring structure according to the present invention includes forming, by printing or the like, a junction layer on a desired terminal electrode on which an electronic component on a first circuit board and an interconnecting board are to be mounted, aligning and then placing the electronic component and the interconnecting board on the first circuit board with the junction layer formed thereon, executing a thermal process on the first circuit board with the electronic component and the interconnecting board placed thereon to melt or cure the junction layer to electrically join the first circuit board to the electronic component and the interconnecting board, forming a junction layer on a desired terminal electrode on which an electronic component on a second circuit board is to be mounted, aligning and then placing the electronic component on the second circuit board with the junction layer formed thereon, executing a thermal process on the second circuit board with the electronic component placed thereon to melt or cure the junction layer to electrically join the electronic component to the second circuit board, sticking or applying a conductive material to a desired terminal electrode on the second circuit board with the electronic component on which the first circuit board with the interconnecting board is to be mounted, aligning and then placing the interconnecting board joined to the first circuit board on the second circuit board, and holding the second circuit board with the first circuit board placed thereon in a pressing and heating state or curing the conductive material by a thermal process or a light irradiating process to electrically join the first circuit board and the second circuit board together via the interconnecting board.

A method of manufacturing an interconnecting board according to the present invention includes using a first mold to injection-mold a first resin into a circuit board shape to which circuit boards are connected in a vertical direction for interconnection to form a three-dimensional molded article, using a second mold to injection-mold a fourth resin into connecting land electrodes and a side surface of the three-dimensional molded article except for an area provided with circuit board connecting wiring that electrically connects connecting land electrodes together, forming a plating catalyst on the connecting land electrode portion on a top surface and a bottom surface of the three-dimensional molded article and on the circuit board connecting wiring portion on the side surface of the three-dimensional molded article, the circuit board connecting wiring portion electrically connecting the connecting land electrodes together, removing the fourth resin and carrying out plating, and using a third mold to injection-mold a second resin to bury terminal portions of the connecting land electrodes in the second resin.

A method of manufacturing the interconnecting board of the present invention further includes carrying out molding to bury the terminal portions of the land electrodes on the interconnecting board between the first insulating resin and second resin which are molded into S-shaped curves.

A method of manufacturing the interconnecting board of the present invention further includes carrying out secondary molding such that wiring of a corner portion extending continuously from the land electrodes on the top and bottom surfaces of the interconnecting board to the side surface portion of the interconnecting board is buried in the resin.

An interconnecting board includes an interconnecting board main body interposed between a first circuit board and a second circuit board, circuit board connecting wiring formed on the interconnecting board main body in association with electric connection points so as to connect a first circuit board-side surface of the interconnecting board main body to a second circuit board-side surface of the interconnecting board main body, and an elastic member formed on at least one of an area between the circuit board connecting wiring and the first circuit board-side surface of the interconnecting board main body and an area between the circuit board connecting wiring and a second circuit board-side surface of the interconnecting board main body.

In the interconnecting board, a gap is formed in one of an area between the interconnecting board main body and the elastic member and an area between the circuit board connecting wiring and the elastic member.

An interconnecting board includes an interconnecting board main body interposed between a first circuit board and a second circuit board, circuit board connecting wiring formed on the interconnecting board main body in association with electric connection points so as to connect a first circuit board-side surface of the interconnecting board main body to a second circuit board-side surface of the interconnecting board main body, and an elastic member mounted on the interconnecting board main body in an area of a surface of the interconnecting board main body located opposite each of the first and second circuit boards on which area the circuit board connecting wiring is not formed.

A three-dimensional wiring structure has a first circuit board and a second circuit board connected together via an interconnecting board, the interconnecting board including an interconnecting board main body interposed between the first circuit board and the second circuit board, and circuit board connecting wiring formed on the interconnecting board main body in association with electric connection points so as to connect a first circuit board-side surface of the interconnecting board main body to a second circuit board-side surface of the interconnecting board main body, wherein an elastic member is mounted on the interconnecting board main body and one of the first and second circuit boards in areas of opposite surfaces of the interconnecting board main body and the first and second circuit boards on which area the circuit board connecting wiring is not formed.

In the three-dimensional wiring structure, the elastic member is formed thinner than the gap between the surface of the interconnecting board main body and the surface of the circuit board.

A three-dimensional wiring structure includes a first circuit board and a second circuit board three-dimensionally connected together via the interconnecting board between the first circuit board and the second circuit board.

A three-dimensional wiring structure has a first circuit board and a second circuit board connected together via an interconnecting board, the interconnecting board including an annular interconnecting board main body interposed between the first circuit board and the second circuit board and having a through-slot formed in a center thereof, and circuit connecting wiring formed on the interconnecting board main body in association with electric connection points so as to connect a first circuit board-side surface of the interconnecting board main body to a second circuit board-side surface of the interconnecting board main body, wherein an elastic member that is thinner than a gap between the first and second circuit boards is provided inside the through-slot in the interconnecting board main body between the first and second circuit boards.

A method of manufacturing a three-dimensional wiring structure includes, when producing a three-dimensional wiring structure having a first circuit board and a second circuit board connected together via an interconnecting board, forming a junction layer on a desired terminal electrode on the first circuit board on which an electronic component and an interconnecting board are to be mounted, aligning and then placing the electronic component and the interconnecting board on the first circuit board with the junction layer formed thereon, executing a thermal process on the first circuit board with the electronic component and the interconnecting board placed thereon to melt or cure the junction layer to electrically join the electronic component and the interconnecting board to the first circuit board, forming a junction layer on a desired terminal electrode on the second circuit board on which an electronic component and the interconnecting board are to be mounted, aligning and then placing the first circuit board with the electronic component and interconnecting board on the second circuit board with the junction layer formed thereon, and executing a thermal process on the second circuit board with the first circuit board with the electronic component and interconnecting board placed thereon to melt or cure the junction layer to electrically join the first circuit board with the electronic component and interconnecting board to the second circuit board.

A method of manufacturing an interconnecting board includes, when producing an interconnecting board interposed between a first circuit board and a second circuit board to constitute a three-dimensional wiring structure, forming an elastic member on a circuit board connecting wiring board, subjecting the circuit board connecting wiring board with the elastic member formed thereon to thin plate working, placing the circuit board connecting wiring hoard subjected to thin plate working in a first mold which has a circuit board shape and to which circuit boards are connected in a vertical direction for interconnection and injecting resin into the first mold to form a three-dimensional molded article, and folding a tip portion of the circuit board connecting wiring board penetrating the three-dimensional molded article formed.

In the method of manufacturing the interconnecting board, the elastic member has a heat resisting temperature higher than that of a molding temperature for the interconnecting board.

A method of manufacturing an interconnecting board includes, when manufacturing an interconnecting board interposed between a first circuit board and a second circuit board to constitute a three-dimensional wiring structure, forming an elastic member on a circuit board connecting wiring board, subjecting the circuit board connecting wiring board with the elastic member formed thereon to thin plate working, injecting a first resin into a first mold which has a circuit board shape and to which circuit boards are connected in a vertical direction for interconnection to form an interconnecting board main body, and pressing the circuit board connecting wiring board subjected to thin plate working, into the interconnecting board main body formed and folding a tip portion of the circuit board connecting wiring board.

In the method of manufacturing the interconnecting board, a spacer jig is inserted or temporarily inserted between the elastic member on the tip portion of the circuit board connecting wiring board and the interconnecting board main body, molding is then carried out, and the spacer jig is removed to form a gap.

In the interconnecting board according to the present invention, the terminal portion of the circuit board connecting wiring provided on the interconnecting board main body is buried in the termination material. The interconnecting board is thus unlikely to be peeled off the circuit boards in spite of a possible thermal shock or falling impact and is strong. This results in improved reliability.

Furthermore, the terminal portion of the circuit board connecting wiring is stuck along the inclined surface formed on the interconnecting board main body and including the corrugated curved surface. The interconnecting board is thus unlikely to be peeled off the circuit boards in spite of a possible thermal shock or falling impact and is strong. This results in improved reliability.

For the corner portion of the circuit board connecting wiring as well as the terminal portion of the circuit board connecting wiring, the interconnecting board main body may be buried in the corner portion processing material or stuck to the inclined surface with the corrugated curved surface. This improves the adhesion between the resin on the interconnecting board, the terminal portion of the land electrode and the corner portion. The corrugated curved surface also inhibits possible shearing stress or peeling stress, resulting in improved reliability.

Further, the electronic components mounted on the first circuit board or the second circuit board can be connected together via the interconnecting board at the electrically shortest distance in the vertical direction. This improves the frequency properties of the three-dimensional wiring structure and increases the speed of signals.

In the interconnecting board according to the present invention, the elastic member is provided between at least one of the circuit board connecting wirings provided on the interconnecting board main body and the interconnecting board main body. This allows impact stress to be easily absorbed from a possible thermal shock or falling impact, resulting in improved reliability.

Furthermore, the elastic member and the gap are formed between at least one of the circuit board connecting wirings provided on the interconnecting board main body and the interconnecting board main body. Thus, a relaxing mechanism based on spring properties acts even with a possible impact or thermal shock. This allows impact stress to be easily absorbed from a possible thermal shock or falling impact, resulting in improved reliability.

Further, the elastic member that is thinner than the gap between the surface of the interconnecting board main body and the surface of the circuit board is formed on the interconnecting board main body. This allows the easy absorption of impact stress caused by a possible thermal shock or falling impact and a force deforming the circuit board, resulting in improved reliability.

Moreover, the elastic member that is thinner than the circuit board gap is formed between the first circuit board and the second circuit board. Thus, the elastic member can absorb stress resulting from the flexure of the central portion of the interconnecting board, which may be significantly deformed. This allows the easy absorption of impact stress caused by a possible thermal shock or falling impact and a force deforming the circuit board, resulting in improved reliability.

Furthermore, the electronic components mounted on the first circuit board and the second circuit board can be connected together via the interconnecting board at the electrically shortest distance in the vertical direction. This improves the frequency properties of the three-dimensional wiring structure and increases the speed of signals.

BRIEF DESCRIPTION OF THE DRAWINGS

FIG. 15 is an enlarged side view of the interconnecting board and circuit board connecting wiring in (Embodiment 9);

FIG. 17 is an enlarged sectional view of an essential part of a three-dimensional wiring structure according to (Embodiment 10) of the present invention;

FIG. 18 is an enlarged sectional view of an essential part of a three-dimensional wiring structure in another example of (Embodiment 10);

FIG. 28 is a sectional view of an electric circuit device in (Patent Document 4);

FIG. 29 is a sectional view of an electric circuit device in (Patent Document 5);

BEST MODE FOR CARRYING OUT THE INVENTION

Embodiments of the present invention will be described below with reference to FIGS. 1 to 12 and 13 to 24.

Embodiment 1

Figure 1:
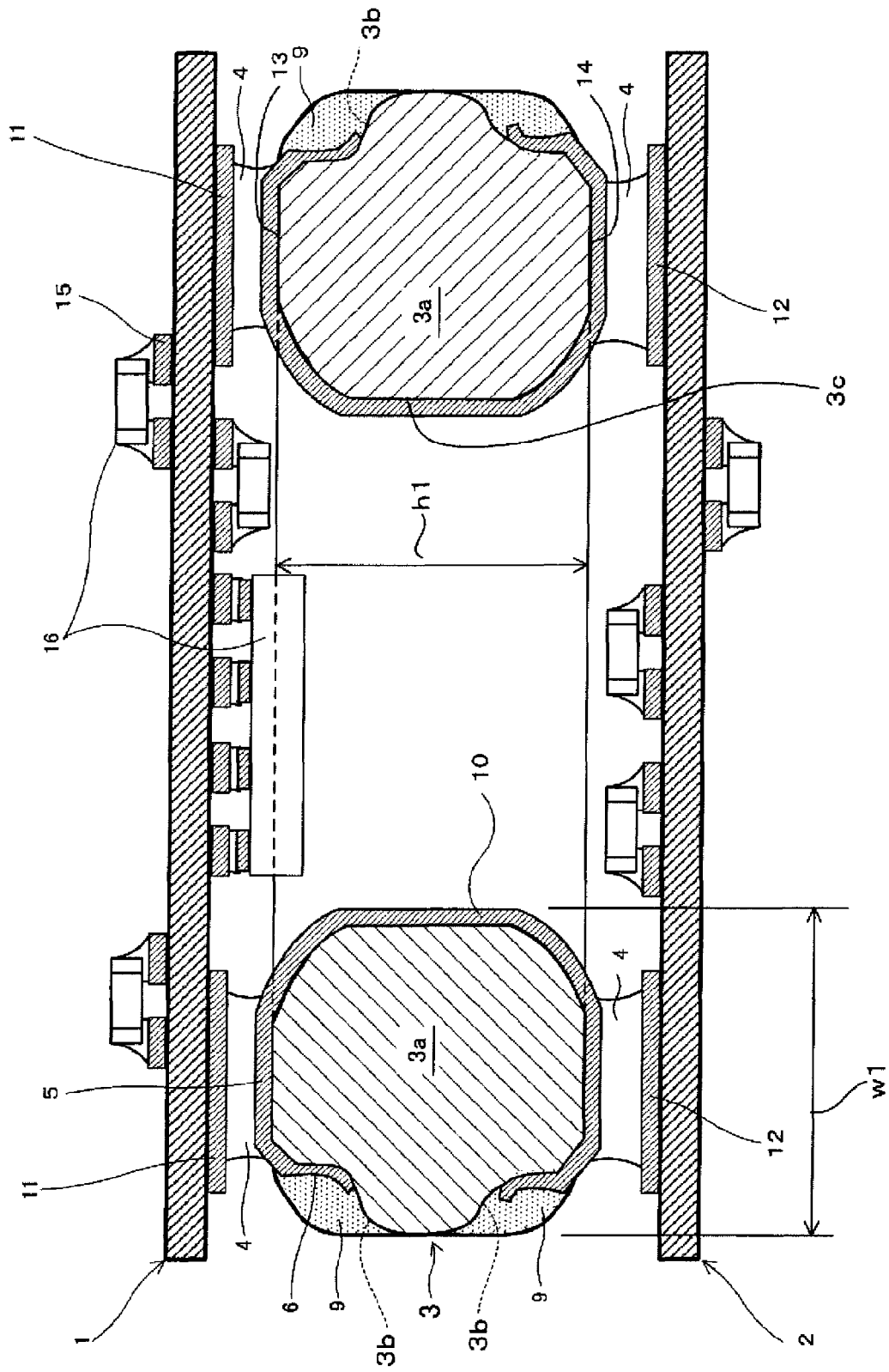
FIG. 1 is a schematic sectional view of a three-dimensional wiring structure according to (Embodiment 1) of the present invention.
Figure 2:
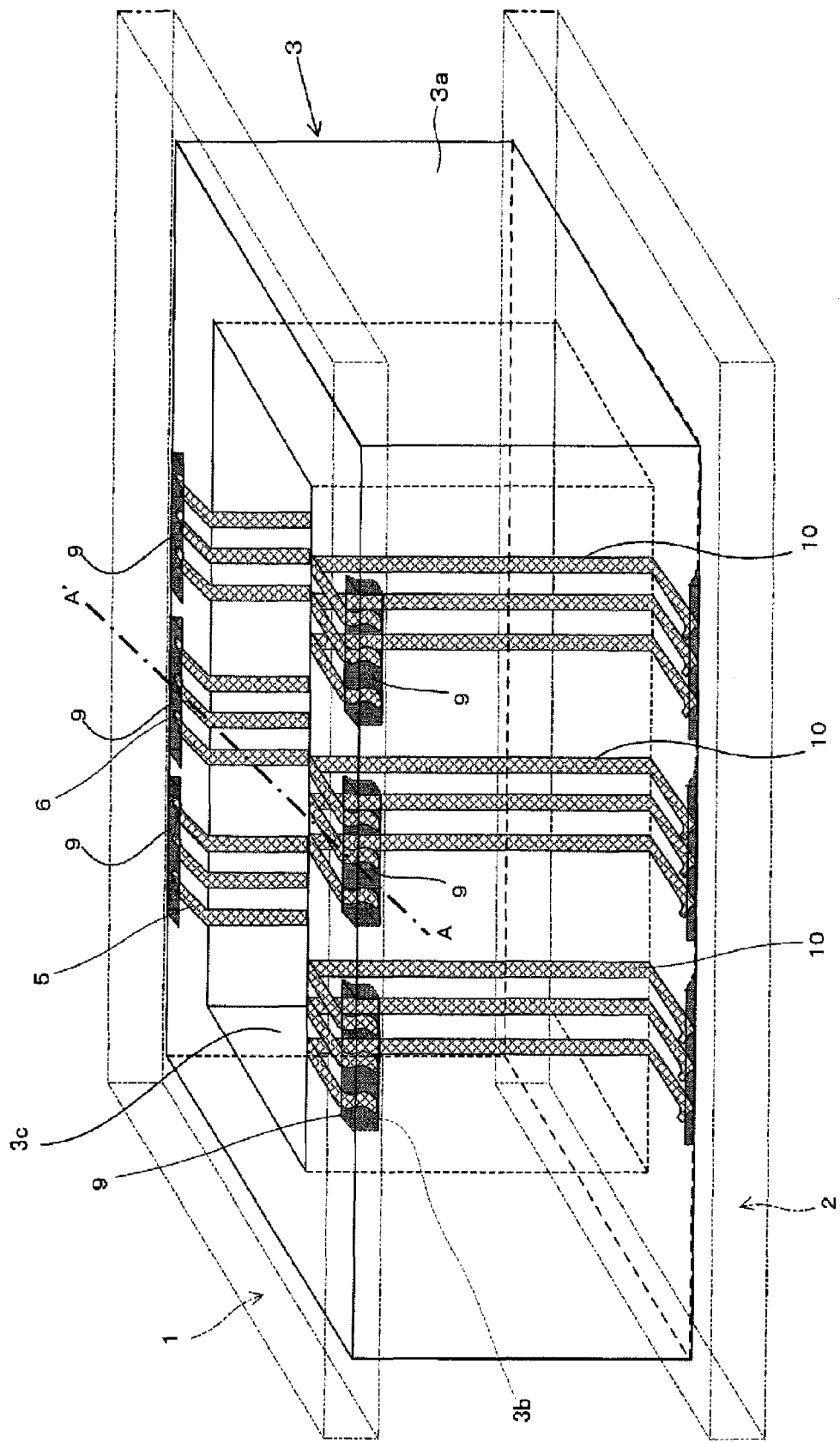
FIG. 2 is a schematic perspective view of an interconnecting board in the three-dimensional wiring structure.

FIGS. 1 and 2 show a three-dimensional wiring structure using an interconnecting board according to (Embodiment 1) of the present invention. FIG. 1 is a sectional view taken along line A-A' in FIG. 2.

The three-dimensional wiring structure shown in FIG. 1 is a three-dimensional connecting structure (three-dimensional module) having a first circuit board 1 and a second circuit board 2 electrically and mechanically connected together via an interconnecting board 3 by means of a junction layer 4.

The first circuit board 1 has electronic components 16 (including semiconductor devices) mounted on opposite surfaces thereof. The first circuit board 1 also has draw-out terminal electrodes 11 drawn out of the respective electronic components. The first circuit board 1 may be a part of a connecting wiring board or functional board connected to another circuit board.

The second circuit board 2 has electronic components (including semiconductor devices) mounted on opposite surfaces thereof. The second circuit board 2 also has draw-out terminal electrodes 12 drawn out of the respective electronic components. The second circuit board 2 may have such a module structure or may be a part of what is called a mother board.

Although not shown in the drawings, each of the first and second circuit boards 1 and 2 is composed of conductive vias and insulating base materials. Each of is the circuit boards is a double-side board or a multilayer wiring board on which the electronic components 16 (including the semiconductor devices) are mounted.

Each of the electronic components 16 is a semiconductor element such as an IC or an LSI, a semiconductor package, or a general passive component such as a resistor, a capacitor, or an inductor. Bare chip-shaped electronic components can be mounted by flip chip mounting or wire bonding connection.

The interconnecting board 3 having a connector function to connect the first circuit board 1 and the second circuit board 2 together has a required number of circuit board connecting wires 10 formed at required positions on an annular interconnecting board main body 3a at predetermined intervals so that the circuit board connecting wires 10 extend from an upper surface 13 corresponding to a rear surface of the first circuit board 1 to a lower surface 14 corresponding to a top surface of the second circuit board 2; the interconnecting board main body 3a has an annular shape with a through-slot 3c formed in the center thereof as shown in FIG. 2. Specifically, the annular interconnecting board main body 3a has a planar shape with a length of 20 mm to 30 mm, a thickness h1 of 1.0 mm to 2.0 mm, and a width w1 of 0.5 mm to 1.0 mm.

In FIG. 2, parts of the first and second circuit boards 1 and 2 positioned over and under the interconnecting board 3 are shown by dotted lines. Actually invisible parts of the interconnecting board 3 in FIG. 2 are partly shown by solid lines so as to make these parts easily understandable. A specific example is those parts of the circuit board connecting wires 10 arranged closer to the reader in FIG. 2 which lie along an inner wall surface of the through-slot 3c in the interconnecting board main body 3a and along the lower surface 14. The circuit board connecting wires 10 arranged farther from the reader in FIG. 2 are configured similarly to those arranged closer to the reader.

In this configuration, each of the draw-out terminal electrodes 11 on the first circuit board 1 is joined via the junction layer 4 to land electrodes 5a of the circuit board connecting wires 10 positioned on the upper surface 13 of the interconnecting board main body 3a. Each of the draw-out terminal electrodes 12 on the second circuit board 2 is joined via the junction layer 4 to land electrodes 5b of the circuit board connecting wires 10 positioned on the lower surface 14 of the interconnecting board main body 3a.

Here, the junction layer 4 may be one of various junction members such as solder, a solder ball, a micro-connector, a heat seal connector, an anisotropic conductive film, and a conductive adhesive.

Thus, the three-dimensional wiring structure using the interconnecting board 3 allows the electronic component 16 to be also mounted in an area of each of the first and second circuit boards 1 and 2 which corresponds to the inside of the through-slot 3c, formed in the center of the interconnecting board 3. This allows more circuit components to be incorporated into the structure while providing appropriate connection areas for the first and second circuit boards 1 and 2. Therefore, dense mounting can be achieved.

Furthermore, electronic components 16 mounted on the first circuit board 1 and the second circuit board 2 are connected via the interconnecting board 3 at the shortest distance. This improves the frequency properties of the three-dimensional wiring structure to enable an increase in the speed of signals, allowing electronic apparatuses to operate at high speeds.

Moreover, recessed portions 3b are formed in the interconnecting board main body 3a at a position corresponding to ends of the circuit board connecting wires 10 of the interconnecting board 3. The ends of the circuit board connecting wires 10 are formed along the inside of the recessed portions 3b, in which a termination material 9 of an insulating resin is filled.

The ends of the circuit board connecting wires 10 are thus buried in the termination material 9. This makes it possible to suppress or buffer peeling or cracking resulting from peeling stress or shearing stress acting between both the upper and lower circuit boards and the land electrodes owing to a possible thermal shock or falling impact. This in turn results in improved reliability.

The first and second circuit boards 1 and 2 may be general resin circuit boards, inorganic circuit boards, or composite circuit boards. In particular, the following circuit boards are preferable: glass epoxy circuit boards, circuit boards using an aramid base material, buildup circuit boards, glass ceramic circuit boards, or alumina circuit boards.

The interconnecting board main body 3a of the interconnecting board 3 may be made up of a general thermal plastic resin, a general thermoset resin, or the like. The thermal plastic resin can be formed into a desired shape by injection molding, cutting processing, laser processing, or chemical processing. The thermoset resin can be formed into a desired shape by cutting a cured material. Preferable examples of the thermal plastic resin include a PPA (polyphthalamide) containing resin, an LCP (liquid crystal polymer) containing resin, a TPX (polymethylbentene) containing resin, a PEI (polyamideimide) containing resin, a PPS (polyphenylenesulfide) containing resin, a PES (polyethersulfane) containing resin, a PSF (polysulfaone) containing resin, a PBT (polybutyleneterephthalate) containing resin, a PA (polyamide) containing resin, an ester containing resin, SPS, PPO, and PPE. A preferable example of the thermoset resin is a normal epoxy resin. The interconnecting board 3 formed of a resin material with a small Young's modulus makes it possible to relax possible shearing stress or peeling stress caused by a difference in the coefficient of thermal expansion between the first and second circuit boards 1 and 2.

The circuit board connecting wires 10 of the interconnecting board 3 are produced by a printing method using a conductive paste or by laser-processing a metal foil stuck to the board surface or a plated layer deposited on a board surface. A three-dimensional wiring material may be metal such as Ag, Sn, Zn, Pd, Bi, Ni, Au, Cu, C, Pt, Fe, Ti, or Pb.

The termination material 9 is selected to be the same as the material of the interconnecting board main body 3a or to adhere well to the interconnecting board main body 3a.

The interconnecting board 3 in FIG. 1 is exaggerated to show the interior in detail but is basically the same as that in FIG. 2. This also applies to the embodiments described below.

Figure 3:
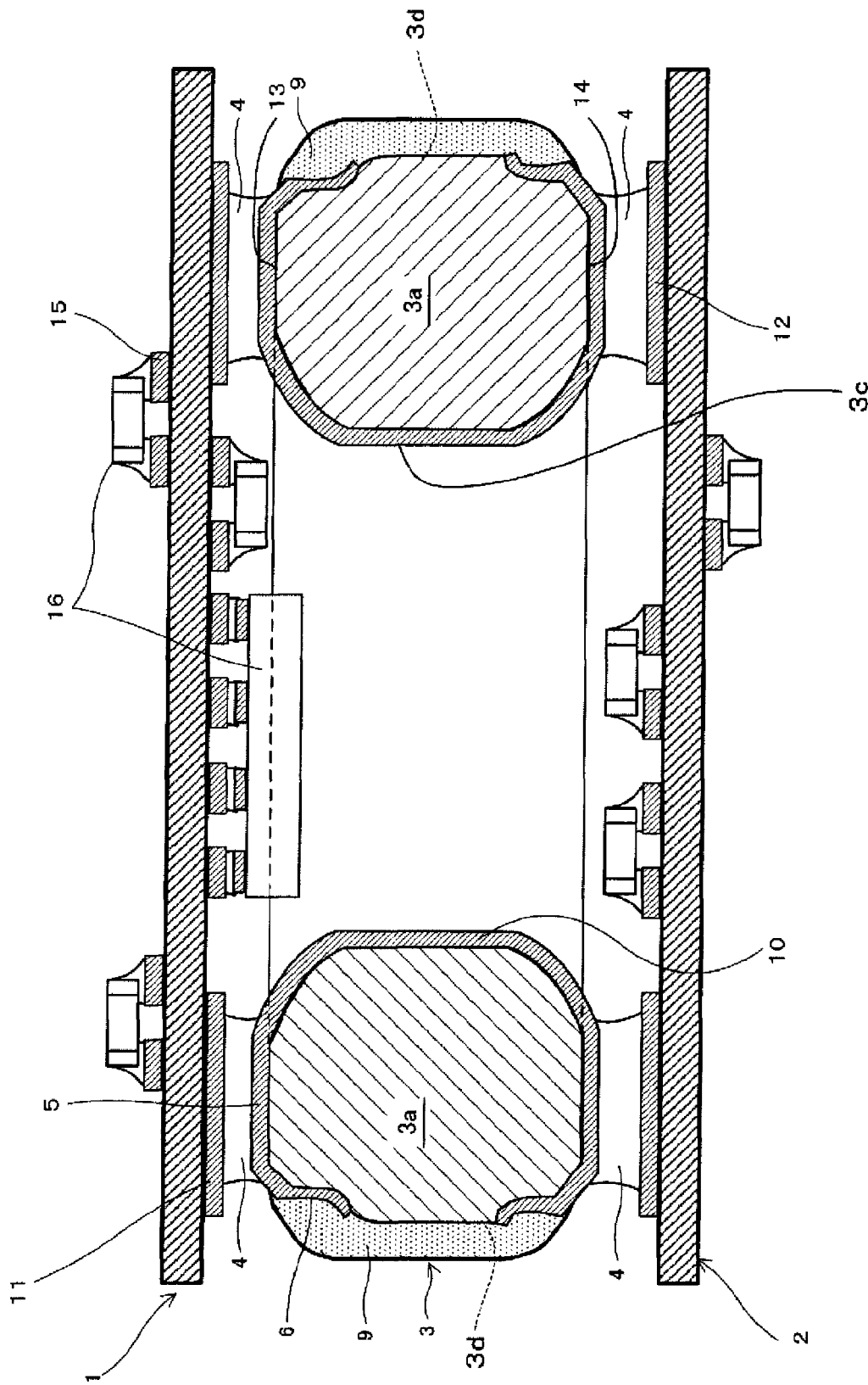
FIG. 3 is a schematic sectional view of a three-dimensional wiring structure in another example of (Embodiment 1) of the present invention.

In FIGS. 1 and 2, the ends of the circuit board connecting wires 10 positioned on the upper and lower surfaces 13 and 14 of the interconnecting board main body 3a are buried in the separate termination materials 9 filled in the respective recessed portions 3b formed in the interconnecting board main body 3a. However, similar effects are expected to be exerted by burying the ends of the circuit board connecting wires 10 positioned on the upper and lower surfaces 13 and 14 of the interconnecting board main body 3a in the termination material 9 filled in a common recessed portion 3d formed in the interconnecting board main body 3a as shown in FIG. 3. In particular, the configuration in FIG. 3 eliminates the need to increase resin molding accuracy required to separate the termination material 9 filled in the recessed portions 3b on the upper surface 13 of the interconnecting board main body 3a from the termination material 9 filled in the recessed portions 3b on the lower surface 14 of the interconnecting board main body 3a as in the case of FIGS. 1 and 2. This enables a reduction in costs.

In the above embodiment, the circuit board connecting wires 10 may be located inside or outside the interconnecting board 3 provided that circuit design and electrical properties are taken into account.

In the above embodiment, both the set of the first circuit board 1-side ends of the circuit board connecting wires 10 and the set of the second circuit board 2-side ends of the circuit board connecting wires 10 are buried in the termination material 9. However, certain effects are expected to be exerted by burying at least one of the set of the first circuit board 1-side ends of the circuit board connecting wires 10 and the set of the second circuit board 2-side ends of the circuit board connecting wires 10, in the termination material 9.

Embodiment 2

Figure 4:
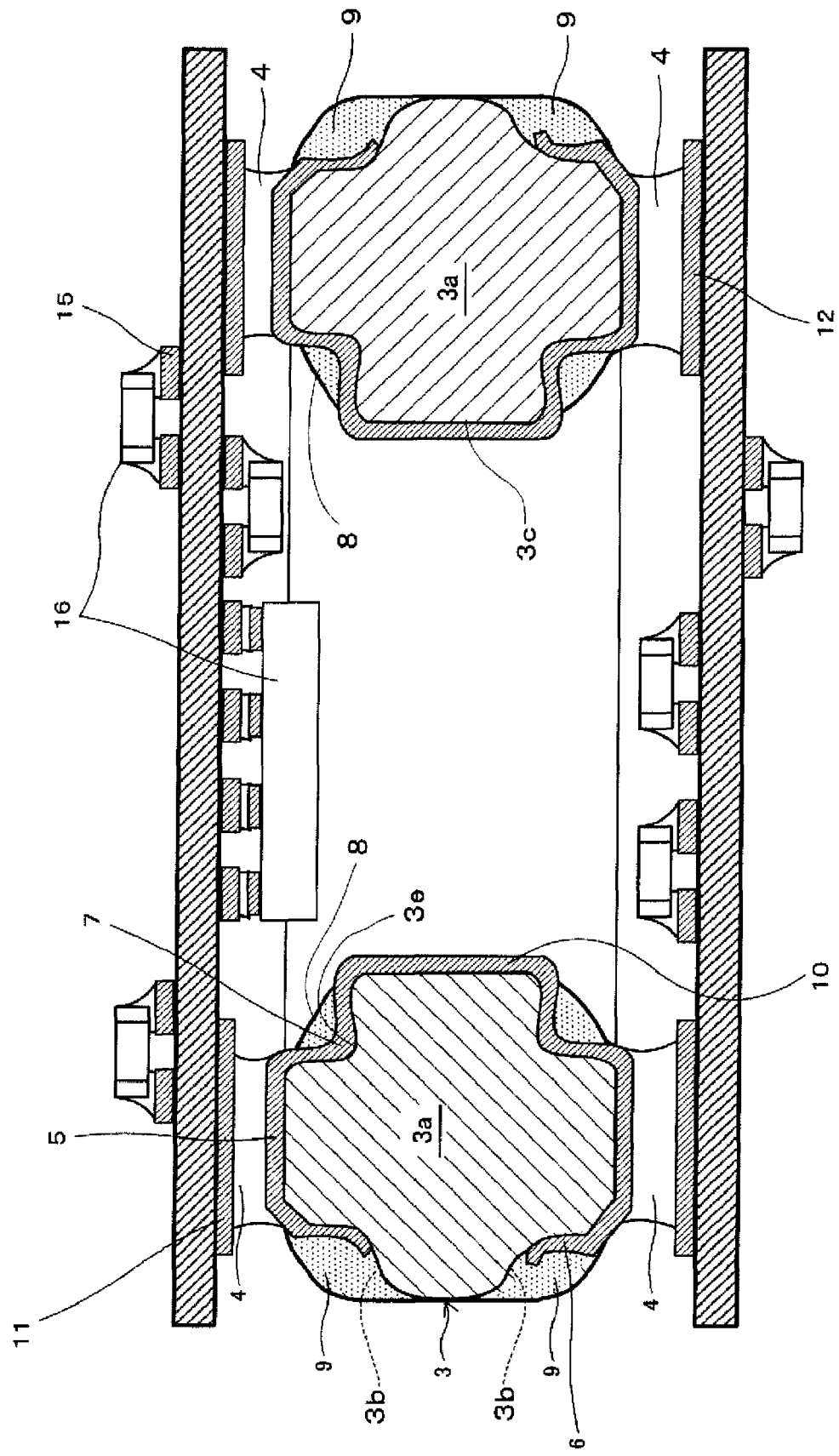
FIG. 4 is a schematic sectional view of a three-dimensional wiring structure according to (Embodiment 2) of the present invention.
Figure 5:
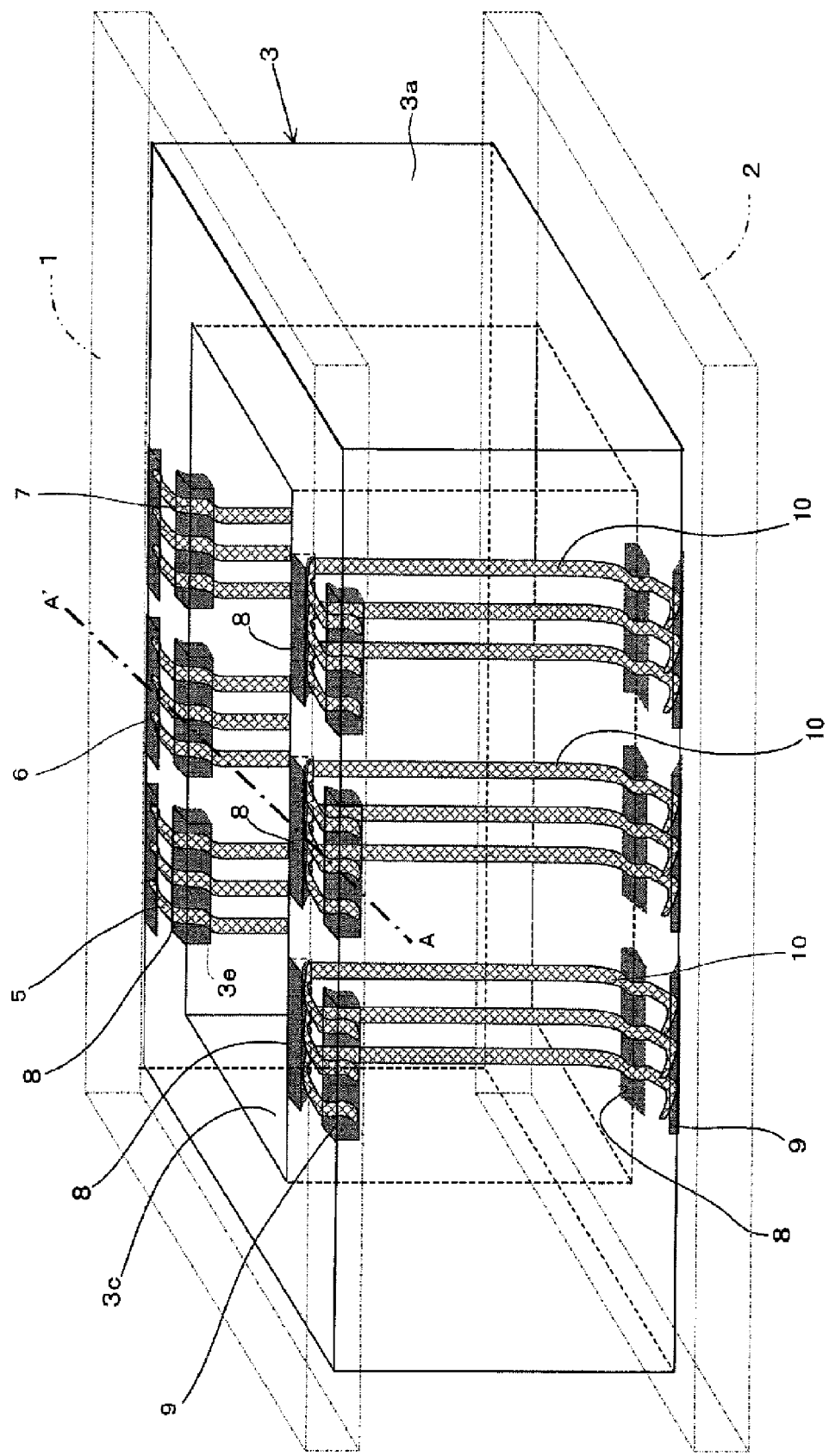
FIG. 5 is a schematic perspective view of an interconnecting board in the three-dimensional wiring structure.

FIGS. 4 and 5 show a three-dimensional wiring structure using an interconnecting board in accordance with (Embodiment 2) of the present invention. FIG. 4 is a sectional view taken along line A-A' in FIG. 5.

The shape of the interconnecting board 3 is different from that in (Embodiment 1). The remaining part of the configuration of the interconnecting board 3 is the same as that in (Embodiment 1). Specifically, in FIG. 1, only the ends of the circuit board connecting wires 10 are buried in the termination material 9. However, in FIG. 4, a set of recessed portions 3e is formed in a corner portion extending continuously from the upper surface 13 of the interconnecting board main body 3a to a side surface portion of the through-slot 3c and in a corner portion extending continuously from the lower surface 14 of the interconnecting board main body 3a to the side surface portion of the through-slot 3c. The circuit board connecting wires 10 are formed along the recessed portions 3e. Resin is filled into the recessed portions 3e as a corner portion processing material 8. Corner portions 7 of the circuit board connecting wires 10 are buried in the corner portion processing material 8. For the cornet portion processing material 8 and the termination material 9, the same resin may be used for all the relevant areas or the resin used may vary depending on the area.

This configuration is more resistant to a thermal shock and a falling impact and is thus very reliable.

In the present embodiment, the set of the recessed portions 3e is formed both in the first circuit board 1-side corner portion 7 of the interconnecting board 3 and in the second circuit board 2-side corner portion 7 of the interconnecting board 3, with the corner portion processing material 8 filled into both sets of the recessed portions 3e. However, certain effects are expected to be exerted by forming the set of the recessed portions 3e in at least one of the first circuit board 1-side corner portion 7 of the interconnecting board 3 and the second circuit board 2-side corner portion 7 of the interconnecting board 3 and filling the corner portion processing material 8 into the recessed portions 3e to bury the corner portions 7 of the circuit board connecting wires 10 in the corner potion processing material 8.

Figure 6:
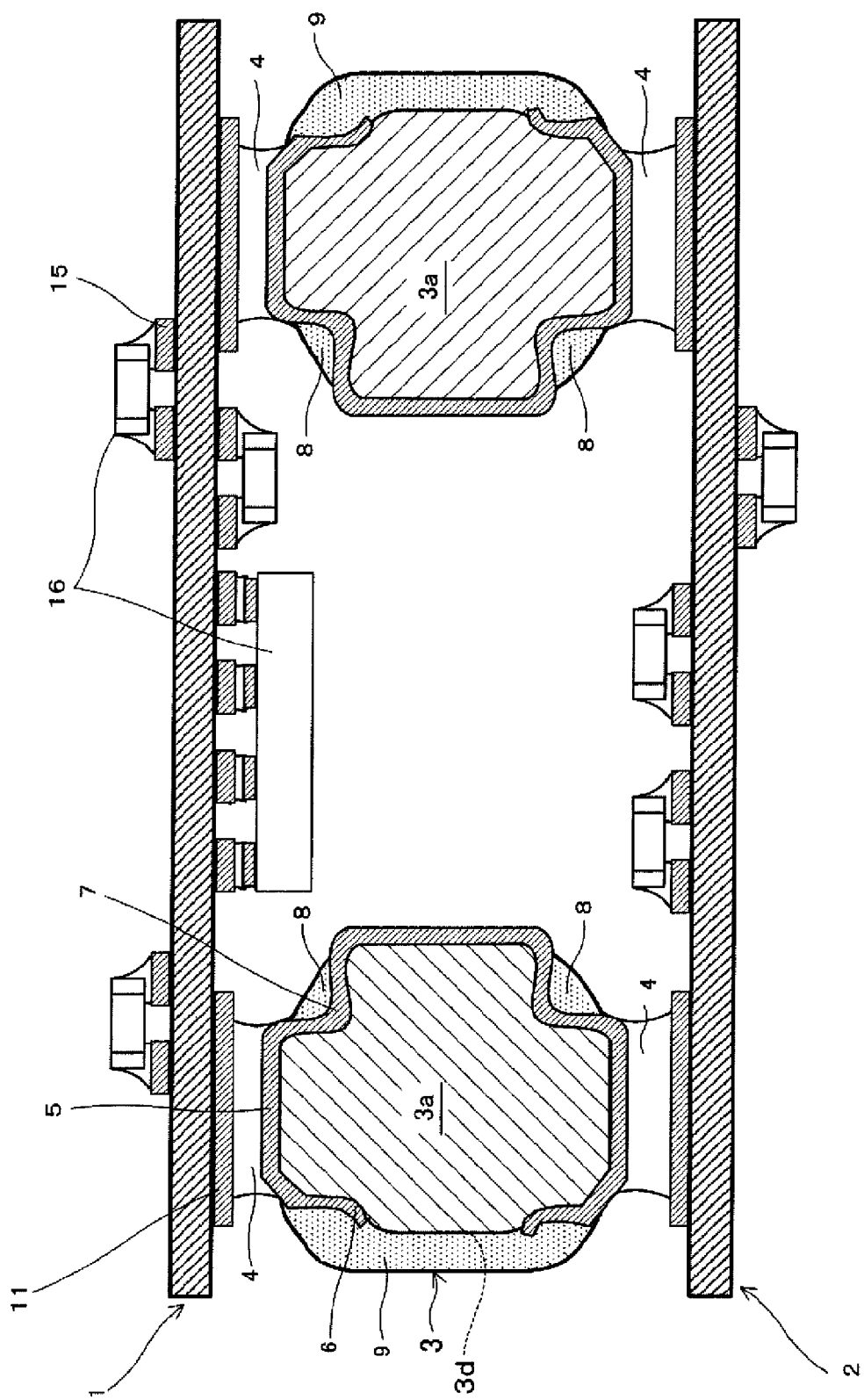
FIG. 6 is a schematic sectional view of a three-dimensional wiring structure in another example of (Embodiment 2) of the present invention.

In FIGS. 4 and 5, the ends of the circuit board connecting wires 10 positioned on the upper and lower surfaces 13 and 14 of the interconnecting board main body 3a are buried in the separate termination materials 9 filled in the respective recessed portions 3b formed in the interconnecting board main body 3a. However, similar effects are expected to be exerted by burying the ends of the circuit board connecting wires 10 positioned on the upper and lower surfaces 13 and 14 of the interconnecting board main body 3*a* in the termination material 9 filled in the common recessed portion 3*d* formed in the interconnecting board main body 3*a* as shown in FIG. 6. In particular, the configuration in FIG. 6 eliminates the need to increase resin molding accuracy required to separate the termination material 9 filled in the recessed portions 3*b* on the upper surface 13 of the interconnecting board main body 3*a* from the termination material 9 filled in the recessed portions 3*b* on the lower surface 14 of the interconnecting board main body 3*a* as in the case of FIGS. 4 and 5. This enables a reduction in costs.

Embodiment 3

Figure 7:
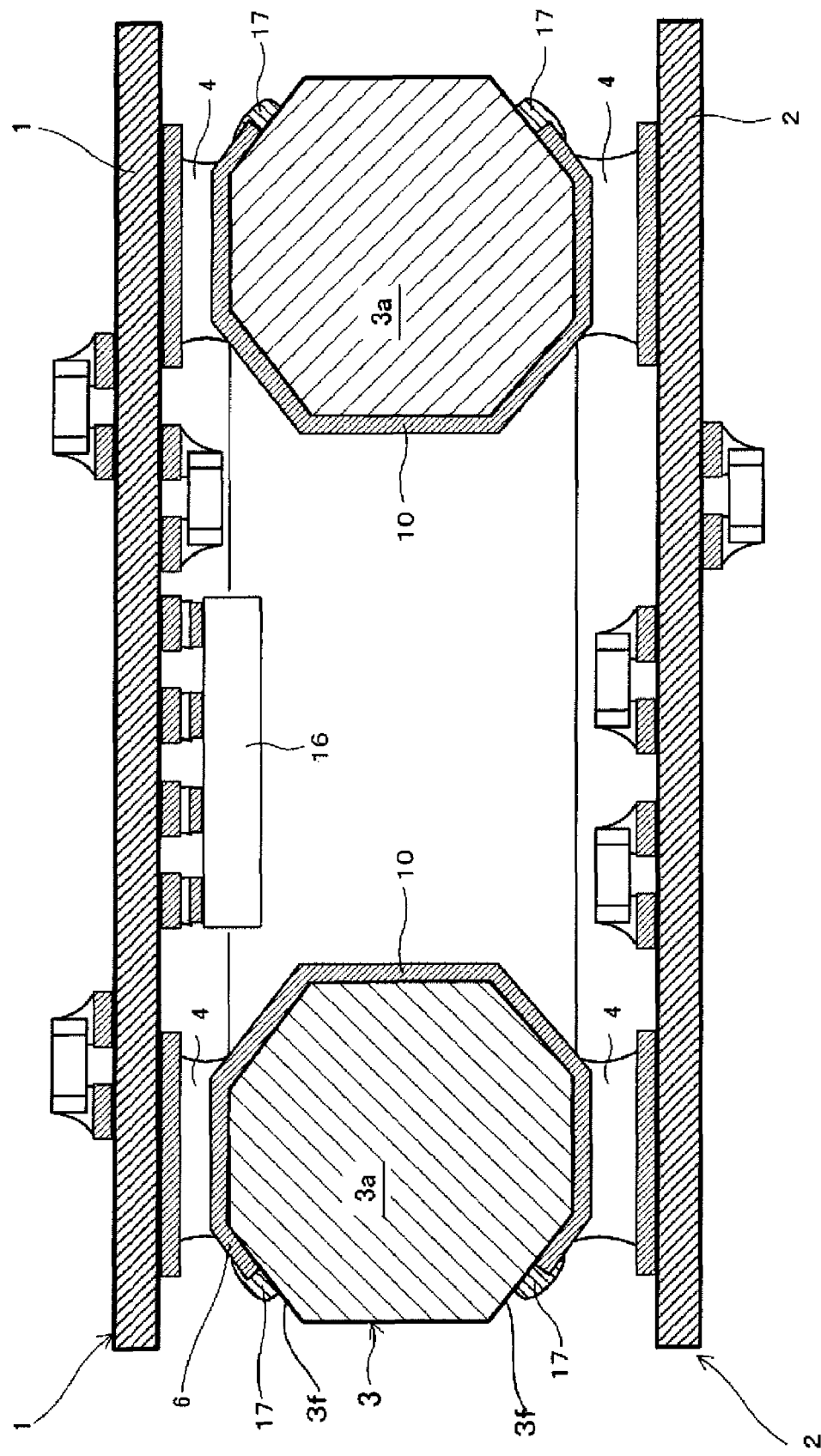
FIG. 7 is a schematic sectional view of a three-dimensional wiring structure according to (Embodiment 3) of the present invention.

FIG. 7 is a schematic sectional view of a three-dimensional structure using an interconnecting board in accordance with (Embodiment 3) of the present invention. The same components as those in FIG. 1 are denoted by the same reference numerals and will not be described below.

In (Embodiment 1), shown in FIG. 1, to allow the first circuit board 1-side ends of the circuit board connecting wires 10 and the second circuit board 2-side ends of the circuit board connecting wires 10 to be buried in the termination material 9, the termination material 9 is filled into the recessed portions 3*b*, formed in the interconnecting board main body 3*a*. However, in FIG. 7, an elastic bonding material 17 is bonded to a surface of the interconnecting board main body 3*a* without forming the recessed portion 3*b* in the interconnecting board main body 3*a*. The first circuit board 1- and second circuit board 2-side ends of the circuit board connecting wires 10 are buried in the bonding material 17, serving as a termination material. In FIG. 7, the interconnecting board main body 3*a* has an octagonal cross section so as to allow the bonding material 17 to be bonded to the interconnecting board main body 3*a*.

The bonding material 17 may be a resin having a smaller Young's modulus than the interconnecting board main body 3*a* and the termination material 9. An example of such a resin is a room temperature vulcanizing (RTV) silicone resin. The remaining part of the configuration of the present embodiment is the same as that of (Embodiment 1). Specifically, (liquid crystal polymer LCP, PPA): 13.8 to 17.0 GPa is used as the interconnecting board main body 3*a* and the termination material 9. RTV silicone: 0.5 to 5 Pa or low-elasticity epoxy: 10 to 100 MPa is used as the bonding material 17.

Thus, the ends of the circuit board connecting wires 10 are covered with and buried in the bonding material 17. This makes it possible to suppress or buffer peeling or cracking resulting from possible shearing stress or peeling stress acting between the first circuit board 1 and the upper land electrode 5 and between the second circuit board 2 and the lower land electrode 5 owing to a possible thermal shock or falling impact. This in turn results in improved reliability.

Embodiment 4

Figure 8:
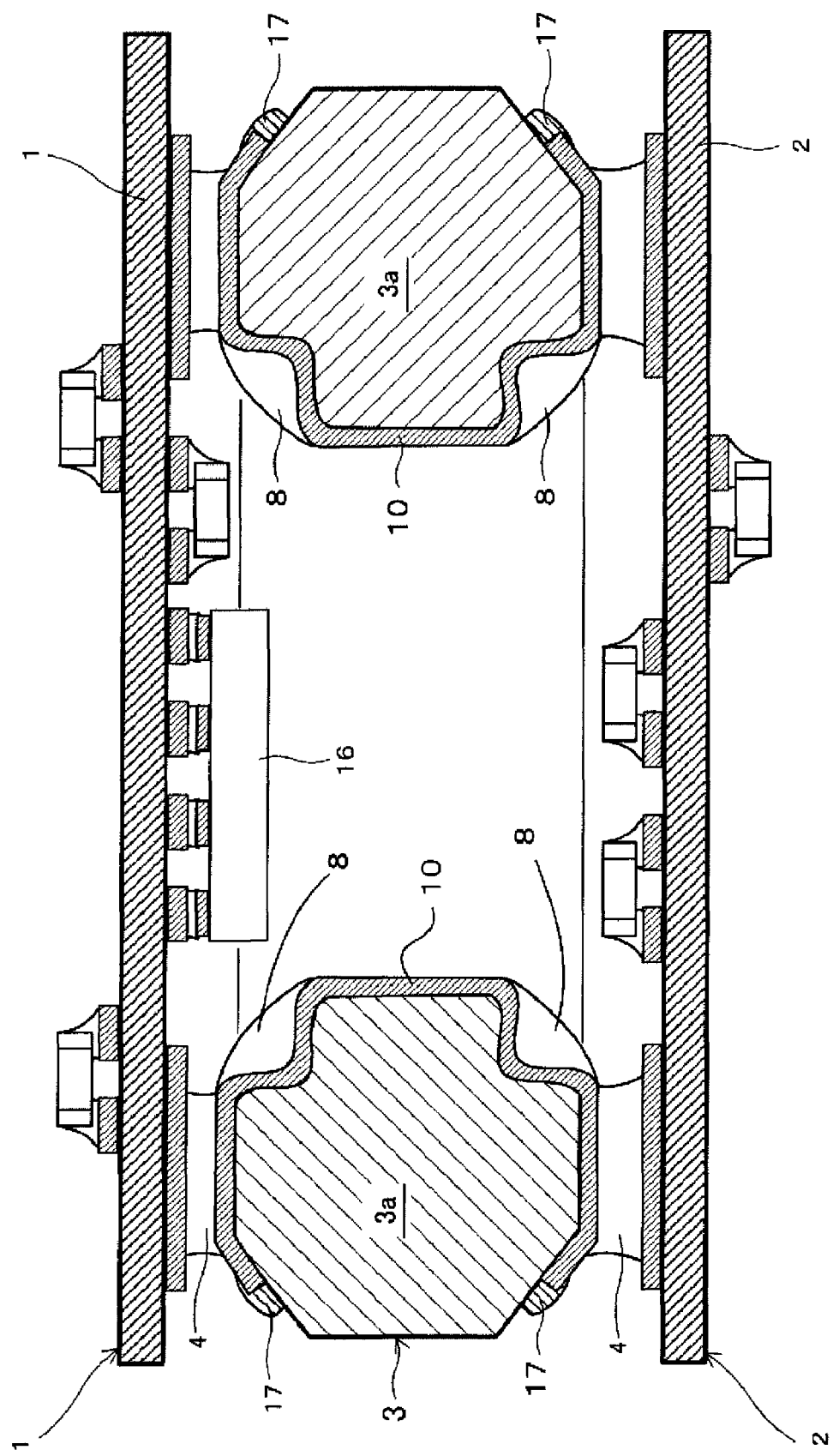
FIG. 8 is a schematic sectional view of a three-dimensional wiring structure according to (Embodiment 4) of the present invention.

FIG. 8 is a schematic sectional view of a three-dimensional wiring structure using an interconnecting board in accordance with (Embodiment 4) of the present invention. The same components as those in FIGS. 1, 4, and 7 are denoted by the same reference numerals and will be described below.

In FIG. 4 for (Embodiment 2), the termination material 9 is filled and buried in the recessed portions 3*b*, formed in the interconnecting board main body 3*a*. However, in (Embodiment 4), as shown in FIG. 8, the interconnecting board main body 3*a* has a sectional shape including inclined sides 3*f* formed at positions corresponding to the ends of the circuit board connecting wires 10 as in the case of FIG. 7. The ends of the circuit board connecting wires 10 are buried in the resin 17 bonded to the inclined surfaces 3*f*. Moreover, as in the case of FIG. 4, the set of the recessed portions 3*e* is formed in the corner portion extending continuously from the upper surface 13 of the interconnecting board main body 3*a* to the side surface portion of the through-slot 3*c* and in the corner portion extending continuously from the lower surface 14 of the interconnecting board main body 3*a* to the side surface portion of the through-slot 3*c*. The circuit board connecting wires 10 are formed along the recessed portions 3*e*. The corner portion processing material 8 is filled into the recessed portions 3*e* to bury the corner portions 7 of the circuit board connecting wires 10 in the corner portion processing material 8.

Figure 12:
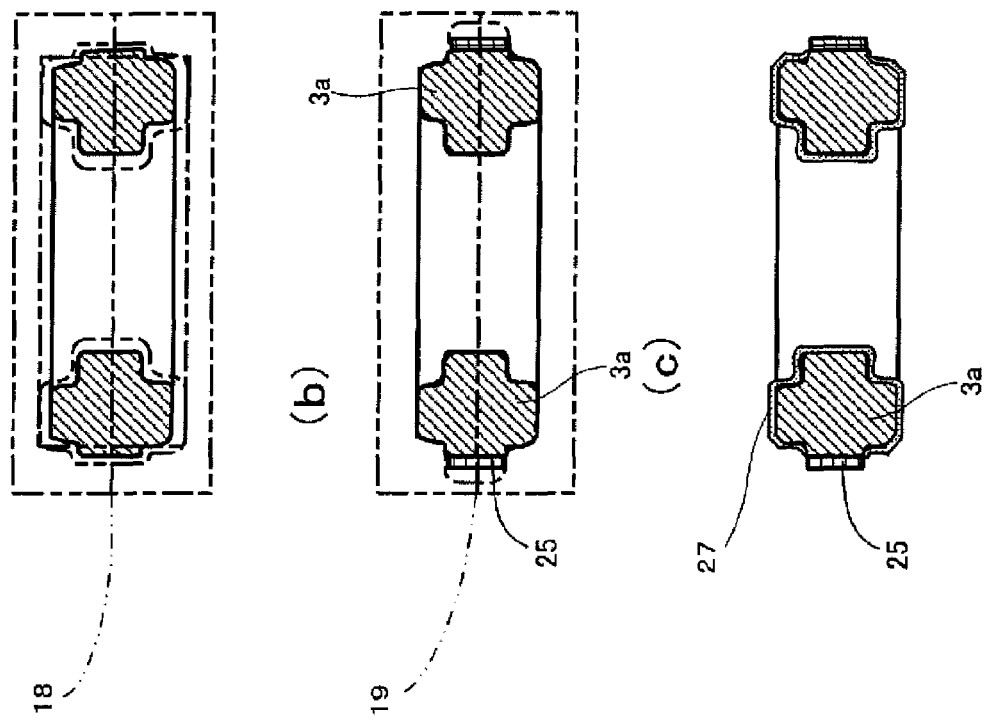
FIG. 12 is a process diagram of a method of manufacturing an interconnecting board according to (Embodiment 8) of the present invention.

This configuration makes it possible not only to improve the reliability, as mentioned in (Embodiment 2), but also to reduce costs and time for delivery. Specifically, it is unnecessary to make a second mold 19 which is shown in FIG. 12 described below and which is required to form the termination material 9. Furthermore, the costs and the time for delivery can be reduced.

Embodiment 5

Figure 9:
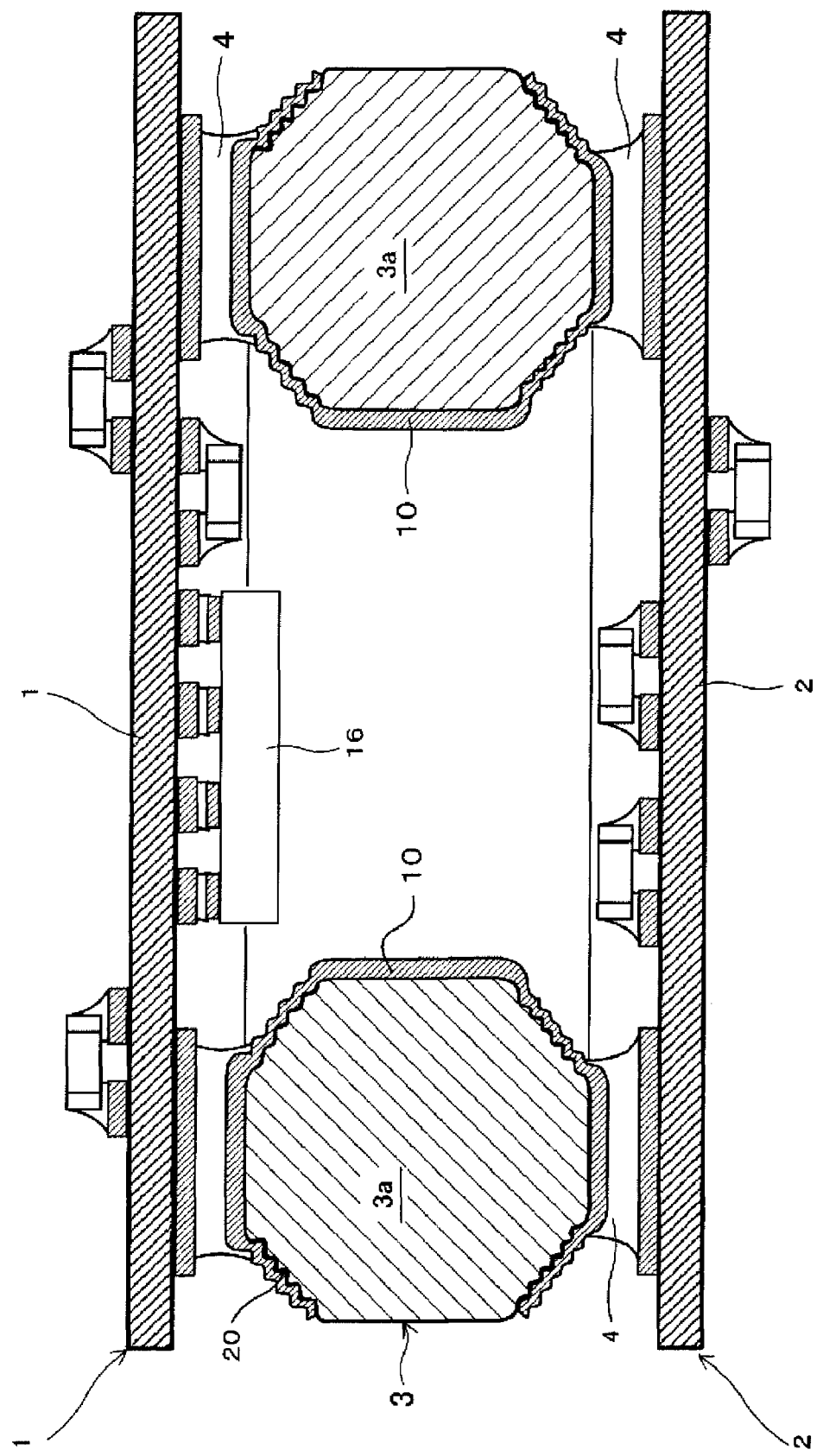
FIG. 9 is a schematic sectional view of a three-dimensional wiring structure according to (Embodiment 5) of the present invention.
Figure 10:
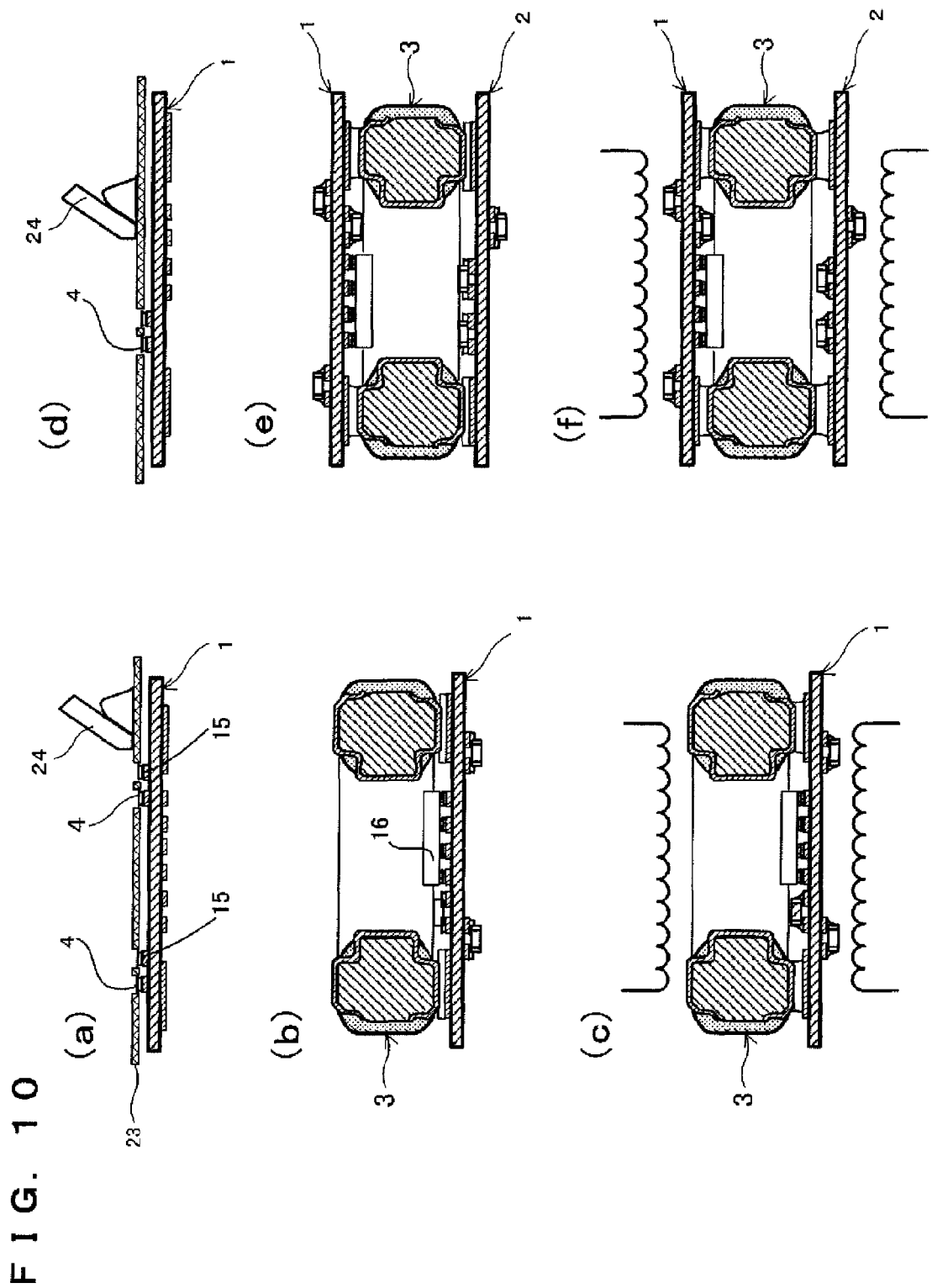
FIG. 10 is a process diagram of a method of manufacturing a three-dimensional wiring structure according to (Embodiment 6) of the present invention.

FIG. 9 is a schematic sectional view of a three-dimensional wiring structure using an interconnecting board in accordance with (Embodiment 5) of the present invention. The same components as those in FIG. 7 are denoted by the same reference numerals and will be described below.

In (Embodiment 3), shown in FIG. 7, the ends of the circuit board connecting wires 10 are buried in the bonding material 17 bonded to the inclined side 3*f* of the interconnecting board main body 3*a*. However, in (Embodiment 5), the inclined side 3*f* is formed into a wavefront-like curved surface 20 as shown in FIG. 9. The corner portion of the interconnecting board main body 3*a* is also formed into the wavefront-like curved surface 20. The ends and corner portions of the circuit board connecting wires 10 are stuck along the wavefront-like curved surface 20.

This configuration improves the adhesion of the ends and corner portions 7 of the circuit board connecting wires 10. The wavefront-like curved surfaces suppress possible shearing stress or pealing stress occurring in the vicinity of the land electrodes 5 as a result of a thermal shock or a falling impact. This results in improved reliability.

In the above embodiments, both the corner portions extending continuously from the first circuit board 1- and second circuit board 2-side surfaces to the side surface portion of the interconnecting board main body 3*a* are formed into inclined surfaces with corrugated curved surfaces, to which the ends of the circuit board connecting wires 10 are stuck. However, certain effects are expected to be exerted by forming at least one of the corner portions extending continuously from the first circuit board 1- and second circuit board 2-side surfaces to the side surface portion of the interconnecting board main body 3*a*, into an inclined surface with a corrugated curved surface and sticking the ends of the circuit board connecting wires 10 to the inclined surface with the corrugated curved surface.

In the embodiments of the present invention, the interconnecting board is rectangular, and the first circuit board and the second circuit board are arranged on the upper and lower surfaces, respectively, of the interconnecting board. However, the present invention is not limited to this. The first circuit board and the second circuit board may be interconnected by, for example, a substantially L-shaped, triangular, or circular interconnecting board.

The interconnecting board 3 in accordance with the embodiments of the present invention has the through-slot 3c in the center thereof. However, the through-slot 3c may be omitted from the interconnecting board. Specifically, instead of the through-slot 3c, a recessed portion is formed in the interconnecting board 3 so as to extend to the middle thereof, with an electronic component mounted in the recessed portion.

Of course, the embodiments of the present invention described above may be applied to one another, and the present invention is not limited to these embodiments.

Embodiment 6

FIGS. 10(a) to 10(f) show a method of manufacturing a three-dimensional wiring structure in accordance with the present invention.

The three-dimensional wiring structure in FIG. 6 is manufactured by the following process.

First, the junction layer 4 is formed, by printing or the like, on the desired terminal electrodes 15 on the is first circuit board 1 on which the electronic component 16 and the interconnecting board 3 are to be mounted (FIG. 10(a)). The junction layer 4 may be formed by plating, printing (printing is performed by the squeegee 24 using the metal plate 23 or a screen), dispensing, or the like.

Then, the electronic component 16 and the interconnecting board 3 are aligned and then placed on the first circuit board 1 with the junction layer 4 formed thereon. At this time, if the electronic component 16 is mounted on both surfaces of the first circuit board 1, the electronic component 16 is placed on an upper (front) side of the first circuit board 1, the first circuit board 1 is then reversed, and the electronic component 16 and the interconnecting board 3 are placed on a lower (back) side of the first circuit board 1 (FIG. 10(b).

The first circuit board 1 with the electronic component 16 and the annular interconnecting board 3 placed thereon is then subjected to a thermal process such as reflow or in a curing oven to melt or cure the junction layer 4 to electrically join the first circuit board 1 to the electronic component 16 and the interconnecting board 3 (FIG. 10(c)). Alternatively, the thermal process may be executed on each of the front and back surfaces for combination.

The junction layer 4 is formed, by printing or the like, on the desired terminal electrodes 15 on the second circuit board 2 on which the electronic component 16 and the interconnecting board 3 is to be mounted (FIG. 10(d)).

The first circuit board 1 with the electronic components 15 and the interconnecting board 3 are then aligned and placed on the second circuit board 2 with the junction layer 4 formed thereon. At this time, if the electronic component 16 is mounted on both surfaces of the second circuit board 2, the electronic component 16 is aligned and then placed on the upper (front) side of the second circuit board 2, the second circuit board 2 is then reversed, and the first circuit board 1 with the electronic component 16 and the interconnecting board 3 is placed on the lower (back) side of the second circuit board 2 (FIG. 10(e)). Also in this case, the back side may be subjected to the thermal process before the front side.

Finally, the second circuit board 2 with the first circuit board 1 with the electronic component 15 and the interconnecting board 3 placed thereon is then subjected to the thermal process such as reflow or in the curing oven to melt or cure the junction layer 4 to electrically join the second circuit board 2 to the first circuit board 1 with the electronic component 16 and the interconnecting board 3 (FIG. 10(f)).

This manufacturing method provides the first circuit board 1 and the second circuit board 2 in the form of separate module circuit boards before connecting the circuit boards together. This allows each module circuit board to be easily inspected for properties.

Embodiment 7

FIGS. 11(a) to 11(i) show a method of manufacturing another three-dimensional wiring structure in accordance with the present invention.

Figure 11:
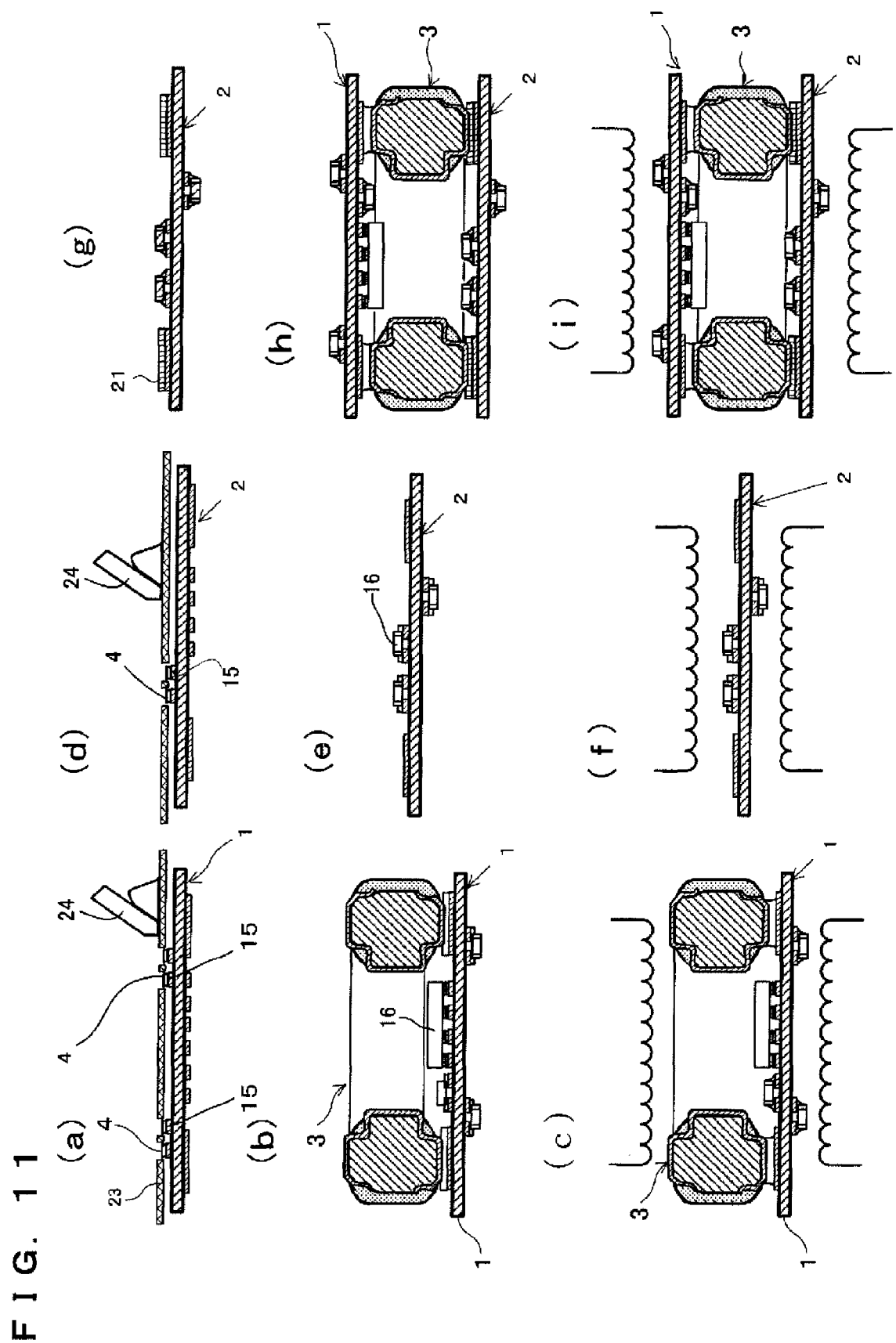
FIG. 11 is a process diagram of a method of manufacturing a three-dimensional wiring structure according to (Embodiment 7) of the present invention.

The three-dimensional wiring structure in FIG. 11 is manufactured by the following process.

First, the junction layer 4 is formed, by printing or the like, on the desired terminal electrodes 15 on the first circuit board 1 on which the electronic component 16 and the interconnecting board 3 are to be mounted (FIG. 11(a)).

Then, the electronic component 16 and the interconnecting board 3 are aligned and then placed on the first circuit board 1 with the junction layer 4 formed thereon (FIG. 11(b)).

The first circuit board 1 with the electronic component 16 and the annular interconnecting board 3 placed thereon is then subjected to the thermal process such as reflow or in the curing oven to melt or cure the junction layer 4 to electrically join the first circuit board 1 to the electronic component 16 and the interconnecting board 3 (FIG. 11(c)).

Then, the junction layer 4 is formed, by printing or the like, on the desired terminal electrodes 15 on the second circuit board 2 on which the electronic component 16 and the interconnecting board 3 are to be mounted (FIG. 11(d)).

Then, the electronic component 16 is aligned and then placed on the second circuit board 2 with the junction layer 4 formed thereon (FIG. 11(e)).

The second circuit board 2 with the electronic component 16 placed thereon is then subjected to the thermal process such as reflow or in the curing oven to melt or cure the junction layer 4 to electrically join the second circuit board 2 to the electronic component 16 and the interconnecting board 3 (FIG. 11(f)).

Then, conductive materials 21 such as anisotropic conductive film sheets or conductive adhesives are stuck or applied to the terminal electrodes 15 on the second circuit board 2 with the electronic component 16 (FIG. 11(g)).

The interconnecting board 3 joined to the first circuit board 1 is then aligned and placed on the second circuit board 2 (FIG. 11(h)).

Finally, the second circuit board 2 with the first circuit board 1 with the interconnecting board 3 placed thereon is held in a pressing and heating state or subjected at least to a thermal process such as a soft beam or in the curing oven or to a light irradiating process using an ultraviolet ray (UV ray) to cure the conductive material. The first circuit board 1 and the second circuit board 2 are thus electrically joined together via the interconnecting board 3 (FIG. 11(i)).

This manufacturing method provides the first circuit board and the second circuit board in the form of separate module circuit boards before connecting the circuit boards together. This allows each module circuit board to be easily inspected for properties. The manufacturing method also enables a reduction in the temperature at which the first circuit board 1 and the second circuit board 2 are connected together. This makes it possible to suppress connection instability resulting from a temperature load on the mounted electronic component 16 or interconnecting board 3, or the possible warpage or swelling of the circuit board or the interconnecting board 3.

This in turn enables the provision of a connection structure that is reliable in electrical and mechanical connections.

Embodiment 8

FIGS. 12(a) to 12(e) show a method of manufacturing the interconnecting board 3 in accordance with the present invention.

The interconnecting board 3 used for the three-dimensional wiring structure in FIG. 6 is manufactured by the following process.

In FIGS. 12(a) to 12(e), reference numeral 18 denotes a first mold, and reference numeral 19 denotes a second mold. Reference numeral 25 denotes a fourth resin, and reference numeral 26 denotes a third mold. The molds and the resins are shown by dotted lines.

First, the first mold 18 is used to injection-mold a first insulating resin into the interconnecting board main body 3a having a circuit board shape that connects the first and second circuit boards 1 and 2 together in a vertical direction (FIG. 12(a)).

Then, the second mold 19 is used to injection-mold the fourth resin 25 into the connecting land electrodes 5 and the side surfaces of the interconnecting board main body 3a except for the areas provided with the circuit board connecting wires 10, electrically connecting the connecting land electrodes 5 together (FIG. 12(b)).

A plating catalyst 27 is formed on the connecting land electrodes 5 on the upper and lower surfaces of the interconnecting board main body 3a and on the circuit board connecting wires 10 on the side surfaces of the interconnecting board main body 3a, the circuit board connecting wires 10 electrically connecting the connecting land electrodes 5 together (FIG. 12(c)).

The fourth resin 25 is then removed and plating is performed (FIG. 12(d)). The fourth resin 25 serves as a resist and can be melted by weak alkali or acid or heat. For example, the use of a biodegradable polylactide resin (PLLA) allows the fourth resin 25 to be melted by weak alkali warm water.

Finally, the third mold 26 is used to injection-mold the termination material 9 to cover and bury a terminal portion 6 of each of the connecting land electrodes 5 with and in the termination material 9 (FIG. 12(e)).

This manufacturing method makes it possible to protect the terminal portion 6 in the vicinity of the land electrode 5 from shearing stress or peeling stress resulting from a thermal shock or a falling impact. This enables the provision of a connecting interconnecting board 3 for electrically and mechanically reliable connections.

If the manufacturing method includes molding the terminal portions 6 of the land electrodes 5 on the interconnecting board 3 formed on the corner portion processing material 8 molded into an S shaped curve so that the terminal portions 6 are buried in the termination material 9, the method makes it possible to more appropriately suppress or buffer shearing stress or peeling stress resulting from a possible thermal shock or falling impact.

If the manufacturing method includes performing secondary molding so that the wires of the corner portions 7 from the land electrodes 5 on the upper and lower surfaces of the interconnecting board 3 to the side surface portion are also buried in the termination material 9, the method makes it possible to more appropriately suppress or buffer shearing stress or peeling stress resulting from a possible thermal shock or falling impact.

Embodiment 9

Figure 13:
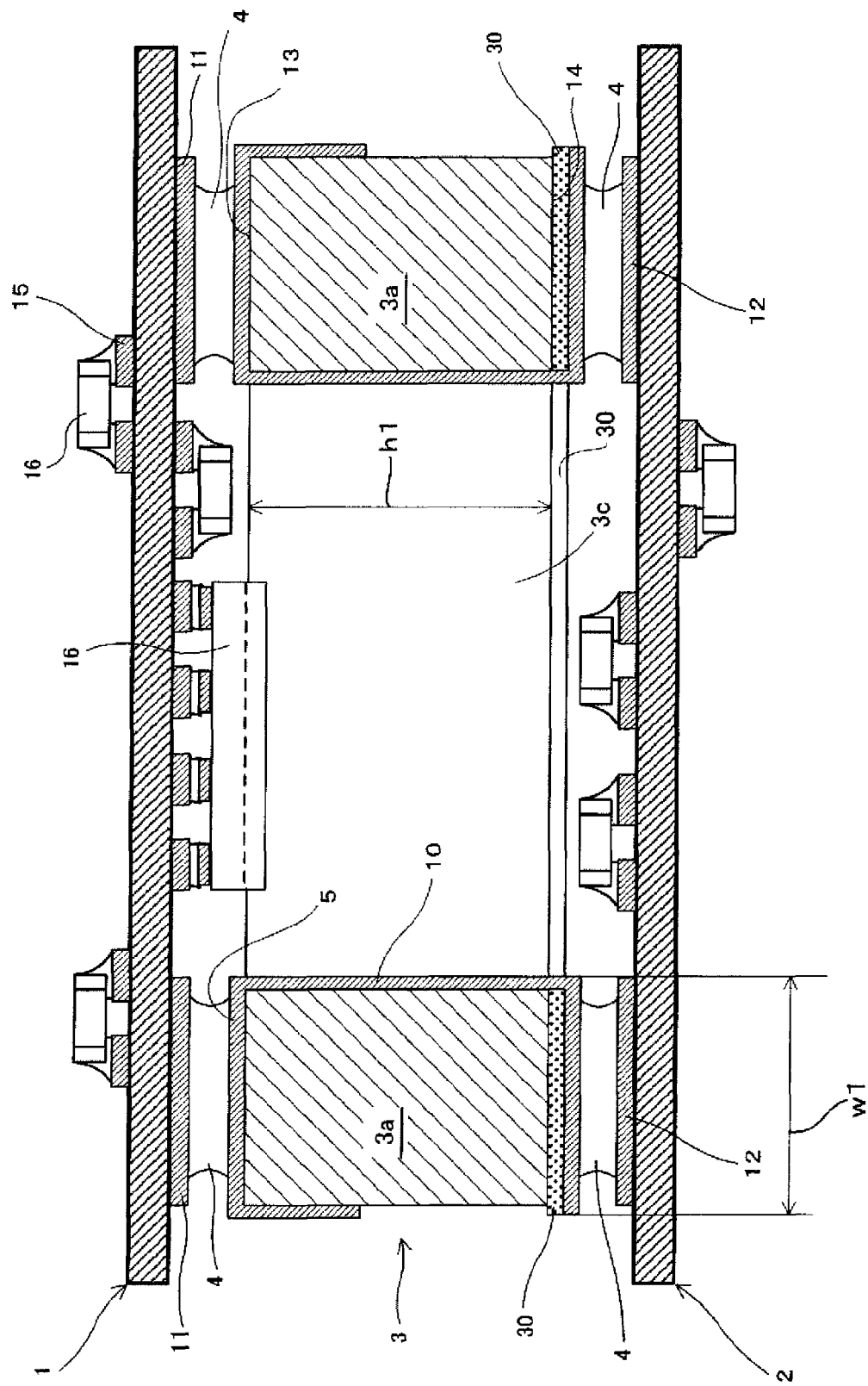
FIG. 13 is a schematic sectional view of a three-dimensional wiring structure according to (Embodiment 9) of the present invention.

FIG. 13 shows a three-dimensional wiring structure using an interconnecting board in accordance with (Embodiment 9) of the present invention. The three-dimensional wiring structure will be described below in brief with reference to FIG. 14 that is a sectional view taken along line A-A'.

The three-dimensional wiring structure shown in FIG. 13 is a three-dimensional connection structure (three-dimensional module) having the first circuit board 1 and the second circuit board 2 electrically and mechanically connected together via the interconnecting board 3 by the junction layer 4.

The first circuit board 1 has the electronic components 16 (including semiconductor devices) mounted on the opposite surfaces thereof. The first circuit board 1 also has the draw-out terminal electrodes 11 drawn out of the respective electronic components. The first circuit board 1 may be a part of a connecting wiring board or functional board connected to another circuit board.

The second circuit board 2 has electronic components (including semiconductor devices) mounted on the opposite surfaces thereof. The second circuit board 2 also has the draw-out terminal electrodes 12 drawn out of the respective electronic components. The second circuit board 2 may have such a module structure or may be a part of what is called a mother board.

Although not shown in the drawings, each of the first and second circuit boards 1 and 2 is composed of conductive vias and insulating base materials. The circuit board may have built-in electronic components or semiconductors. Each of the circuit boards is a double-side board or a multilayer wiring board on which the electronic components 16 are mounted. Each of the electronic components 16 is a semiconductor element such as an IC or an LSI, a semiconductor package, or a general passive component such as a resistor, a capacitor, or an inductor. Bare chip-shaped electronic components can be mounted by flip chip mounting or wire bonding connection.

Figure 14:
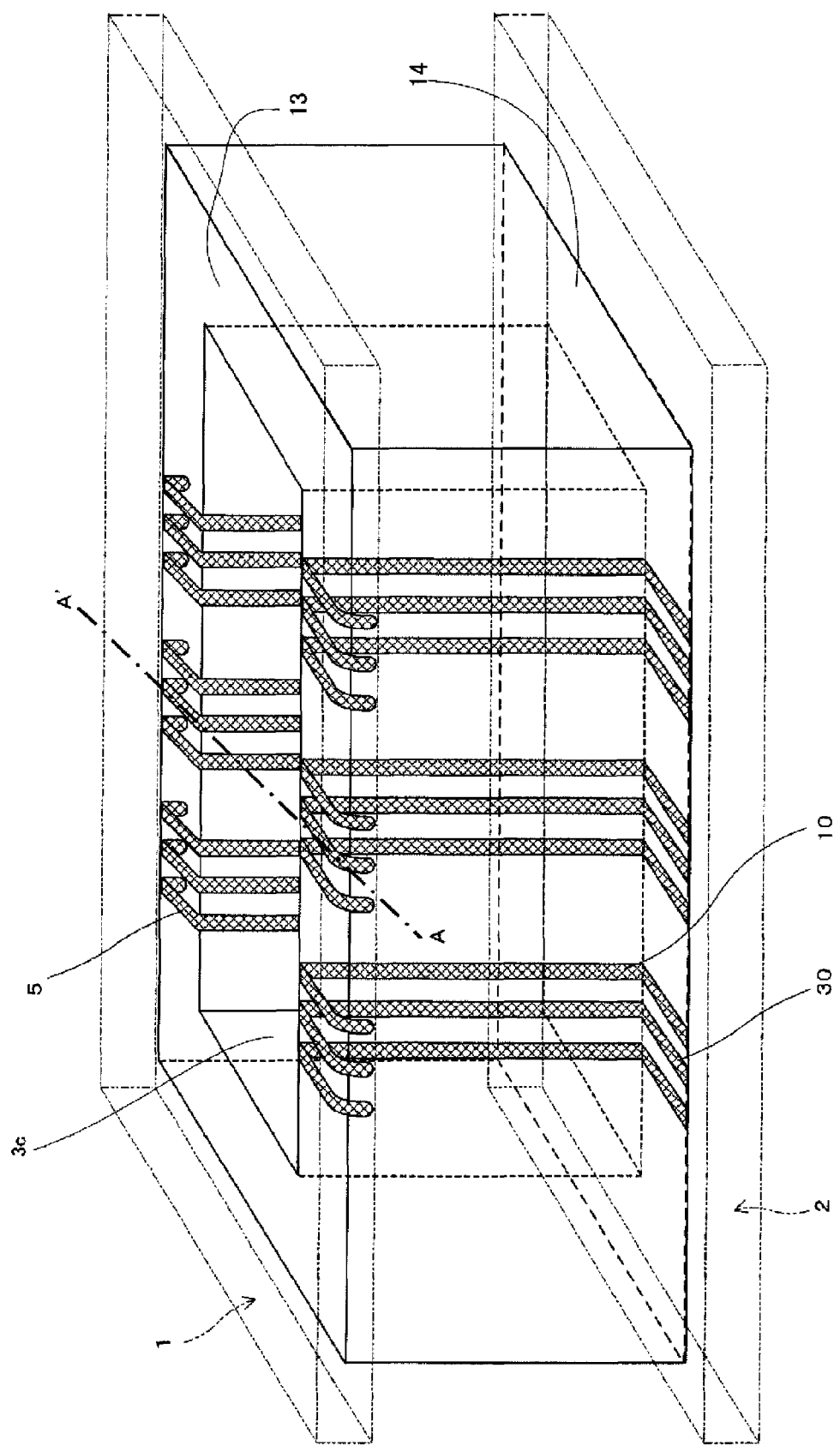
FIG. 14 is a schematic perspective view of an interconnecting board in the three-dimensional wiring structure.

The interconnecting board 3 having a connector function to connect the first circuit board 1 and the second circuit board 2 together has a required number of circuit board connecting wires 10 formed at the required positions on the annular interconnecting board main body 3a at the predetermined intervals so that the circuit board connecting wires 10 extend from the upper surface 13 corresponding to the rear surface of the first circuit board 1 to the lower surface 14 corresponding to the top surface of the second circuit board 2; the interconnecting board main body 3a has an annular shape with the through-slot 3c formed in the center thereof as shown in FIG. 14. Specifically, the annular interconnecting board main body 3a has a planar shape with a length of 20 mm to 30 mm, a thickness h1 of 1.0 mm to 2.0 mm, and a width w1 of 0.5 mm to 1.0 mm.

In FIG. 14, parts of the first and second circuit boards 1 and 2 positioned over and under the interconnecting board 3 are shown by dotted lines. Actually invisible parts of the interconnecting board 3 in FIG. 14 are partly shown by solid lines so as to make these parts easily understandable. A specific example is those parts of the circuit board connecting wires 10 arranged closer to the reader in FIG. 14 which lie along the inner wall surface of the through-slot 3c in the interconnecting board main body 3a and along the lower surface 14. The circuit board connecting wires 10 arranged farther from the reader in FIG. 14 are configured similarly to those arranged closer to the reader.

In this configuration, each of the draw-out terminal electrodes 11 on the first circuit board 1 is joined via the junction layer 4 to the land electrodes 5 of the circuit board connecting wires 10 positioned on the upper surface 13 of the interconnecting board main body 3a. Each of the draw-out terminal electrodes 12 on the second circuit board 2 is joined via the junction layer 4 to the land electrodes 5 of the circuit board connecting wires 10 positioned on the lower surface 14 of the interconnecting board main body 3a.

Here, the junction layer 4 may be one of various junction members such as solder, a solder ball, a micro-connector, a heat seal connector, an anisotropic conductive film, and a conductive adhesive; the solder, solder ball, micro-connector, or heat seal connector is melted, and the anisotropic conductive film or conductive adhesive is cured.

The three-dimensional wiring structure using the interconnecting board 3 allows the electronic component 16 to be also mounted in an area of each of the first and second circuit boards 1 and 2 which corresponds to the inside of the through-slot 3c, formed in the center of the interconnecting board 3. This allows more circuit components to be incorporated into the structure while providing appropriate connection areas for the first and second circuit boards 1 and 2. Therefore, dense mounting can be achieved.

Furthermore, the electronic component 16 mounted on the first circuit board 1 or the second circuit board 2 is connected via the interconnecting board 3 at the shortest distance. This improves the frequency properties of the three-dimensional wiring structure to enable an increase in the speed of signals, allowing electronic apparatuses to operate at high speeds.

Moreover, an elastic member 30 made of a material that is more elastic than the interconnecting board main body 3a is provided between parts of the circuit board connecting wires 10 on the interconnecting board 3 which are closer to at least one of the circuit boards and the interconnecting board main body 3a. In FIGS. 13 and 14, the elastic member 30 is provided between the second circuit board 2-side part of the interconnecting board main body 3a and the second circuit board 2-side parts of the circuit board connecting wires 10. More specifically, the elastic member 30 is formed all over the lower surface of the interconnecting board main body 3a. FIG. 15(a) is an enlarged side view of the interconnecting board main body 3a and the circuit board connecting wires 10. This also applies to a case in which the elastic member 30 is provided between the first circuit board 1-side part of the interconnecting board main body 3a and the first circuit board 1-side parts of the circuit board connecting wires 10.

The excellent elastic member 30 easily absorbs impact stress caused by a possible thermal shock or falling impact, resulting in improved reliability.

The first and second circuit boards 1 and 2 may be general resin circuit boards, inorganic circuit boards, or composite circuit boards. In particular, the following circuit boards are preferable: glass epoxy circuit boards, circuit boards using an aramid base material, buildup circuit boards, glass ceramic circuit boards, or alumina circuit boards.

The interconnecting board main body 3a of the interconnecting board 3 may be made up of a general thermal plastic resin, a general thermoset resin, or the like. The thermal plastic resin can be formed into a desired shape by injection molding, cutting processing, laser processing, or chemical processing. The thermoset resin can be formed into a desired shape by cutting a cured material. Preferable examples of the thermal plastic resin include a PPA (polyphthalamide) containing resin, an LCP (liquid crystal polymer) containing resin, a TPX (polymethylbentene) containing resin, a PEI (polyamideimide) containing resin, a PPS (polyphenylenesulfide) containing resin, a PES (polyethersulfone) containing resin, a PSF (polysulfaone) containing resin, a PBT (polybutyleneterephthalate) containing resin, a PA (polyamide) containing resin, an ester containing resin, SPS, PPO, and PPE. A preferable example of the thermoset resin is a normal epoxy resin. The interconnecting board 3 and elastic member 30 formed of a resin material with a small Young's modulus such as a silicone resin make it possible to relax possible shearing stress or peeling stress caused by a difference in the coefficient of thermal expansion between the first and second circuit boards 1 and 2.

The circuit board connecting wires 10 on the interconnecting board 3 may be semiconductor lead frames (Cu+Ni) or metal leads made of SUS or phosphor bronze (92Cu-8Sn). The three-dimensional wiring material may be metal such as Ag, Sn, Zn, Pd, Bi, Ni, Au, Cu, C, Pt, Fe, Ti, Pb, or Au. The material preferably has excellent spring properties and a small CTE (Coefficient of Thermal Expansion) in view of impact reliability and thermal shock reliability.

A material selected for the elastic member 30 has a smaller elastic modulus (Young's modulus) than the interconnecting board main body 3a and adheres well to the interconnecting board main body 3a or the circuit board connecting wires 10. For example, the material may be a silicone resin, which has a higher heat resistant temperature than the material of the interconnecting board main body 3a as required for room temperature vulcanizing (RTV) or the like. The RTV silicone has an elastic modulus of 0.5 to 5 Pa.

The interconnecting board main body 3a may be made of a (liquid crystal polymer LCP, PPA):13.8 to 17.0 GPa. The elastic member 30 may be made of a RTV silicone: 0.5 to 5 Pa or a low electricity epoxy: 10 to 100 MPa.

The interconnecting board 3 in FIG. 13 is exaggerated to show the interior in detail but is basically the same as that in FIG. 14. This also applies to embodiments described below.

Figure 16:
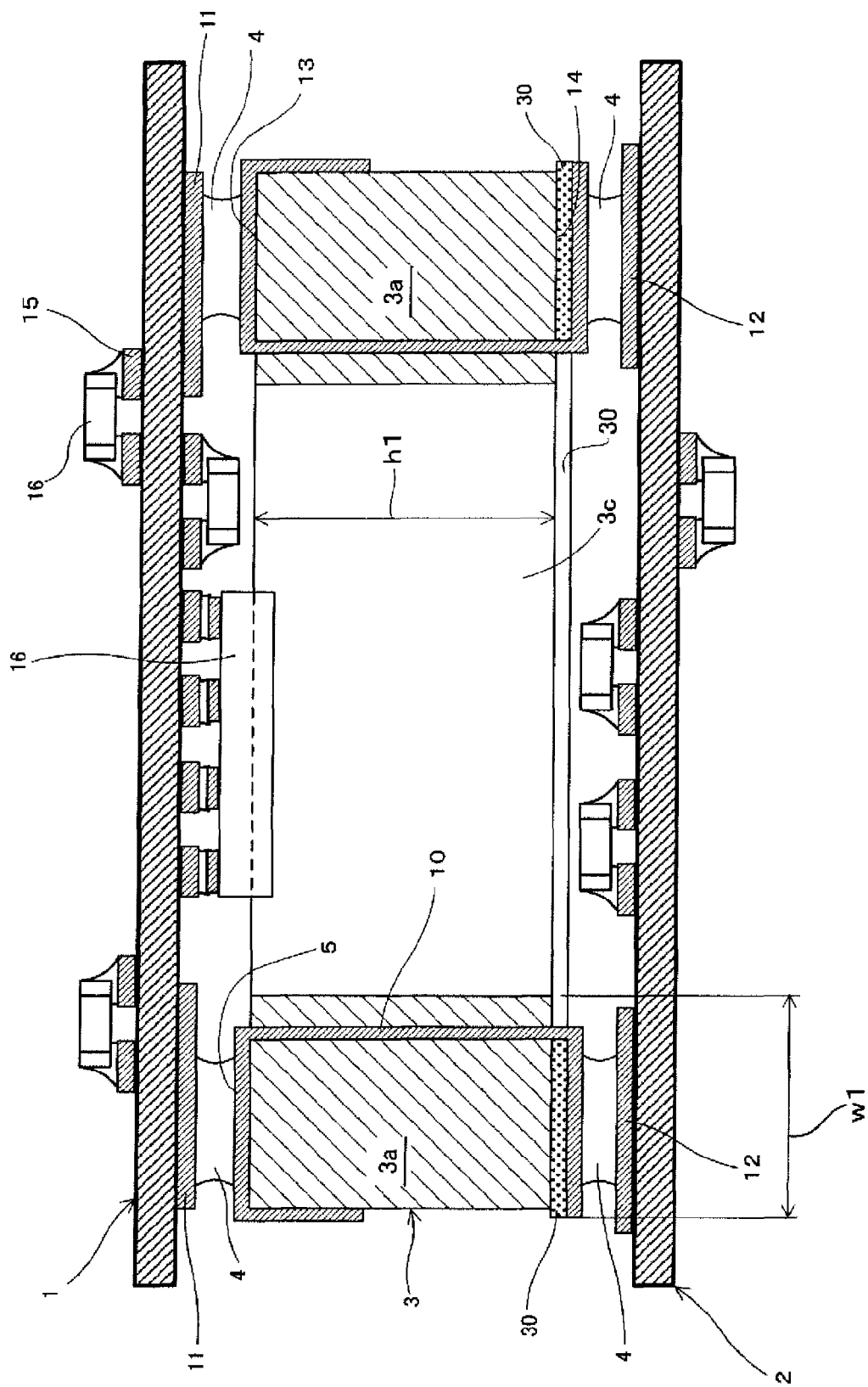
FIG. 16 is a schematic sectional view of a three-dimensional wiring structure in another example of (Embodiment 9)

In FIGS. 13 and 14, the circuit board connecting wires 10 are arranged around the periphery of the interconnecting board main body 3a. However, similar effects are expected to be exerted when the circuit board connecting wires 10 penetrate the interconnecting board main body 3a as shown in FIG. 16. In particular, in the case of FIG. 16, compared to the case of FIG. 13, vertical portions of the circuit board connecting wires 10 are buried in the interconnecting board main body 3a and are thus unlikely to peel off, resulting in improved reliability. The free side surface of the interconnecting board main body 3a can be used for a function of, for example, mounting shields or other components on the side surface or for increasing the circuit density.

In the above embodiments, the circuit board connecting wires 10 may be located inside or outside the interconnecting board 3 provided that the circuit design and electrical properties are taken into account.

In the above embodiments, the elastic member is formed between the second circuit board 2-side parts of the circuit board connecting wires 10 and the interconnecting board main body 3a. However, impact stress caused by a possible thermal shock or falling impact is more easily absorbed by also forming the elastic member between the first circuit board 1-side parts of the circuit board connecting wires 10 and the interconnecting board main body 3a. This results in further improved reliability.

In FIGS. 13 to 16, the elastic member 30 is provided all over the lower surface of the interconnecting board main body 3a. However, the elastic member 30 may be provided only on the circuit board connecting wires 10 as shown in FIG. 15(b).

Embodiment 10

FIG. 17 shows a three-dimensional wiring structure using an interconnecting board in accordance with (Embodiment 10) of the present invention. The interconnecting board 3 has a shape different from that shown in FIG. 13. The remaining part of the configuration is the same as that shown FIG. 13.

Specifically, in FIG. 13, the elastic member 30 is formed between the circuit board connecting wires 10 and the interconnecting board main body 3a without any gap therebetween. However, in FIG. 17, a gap 31 is formed between the elastic member 30 formed on the circuit board connecting wires 10 and the interconnecting board main body 3.

This configuration not only exerts the effects of (Embodiment 9), described above, but also provides a relaxing mechanism based on the spring properties of the circuit board connecting wires 10, resulting from the presence of the gap 31. This allows impact stress caused by a possible thermal shock or falling impact to be more easily absorbed, resulting in further improved reliability. The gap 31 is desirably about 0 to 0.5 mm in terms of processability and impact absorption.

FIG. 18 shows another example. In FIG. 18, the gap 31 is formed between the elastic member 30 formed on the interconnecting board main body 3 and the circuit board connecting wires 10. This is expected to exert effects similar to those produced in the case of FIG. 17.

Embodiment 11

Figure 19:
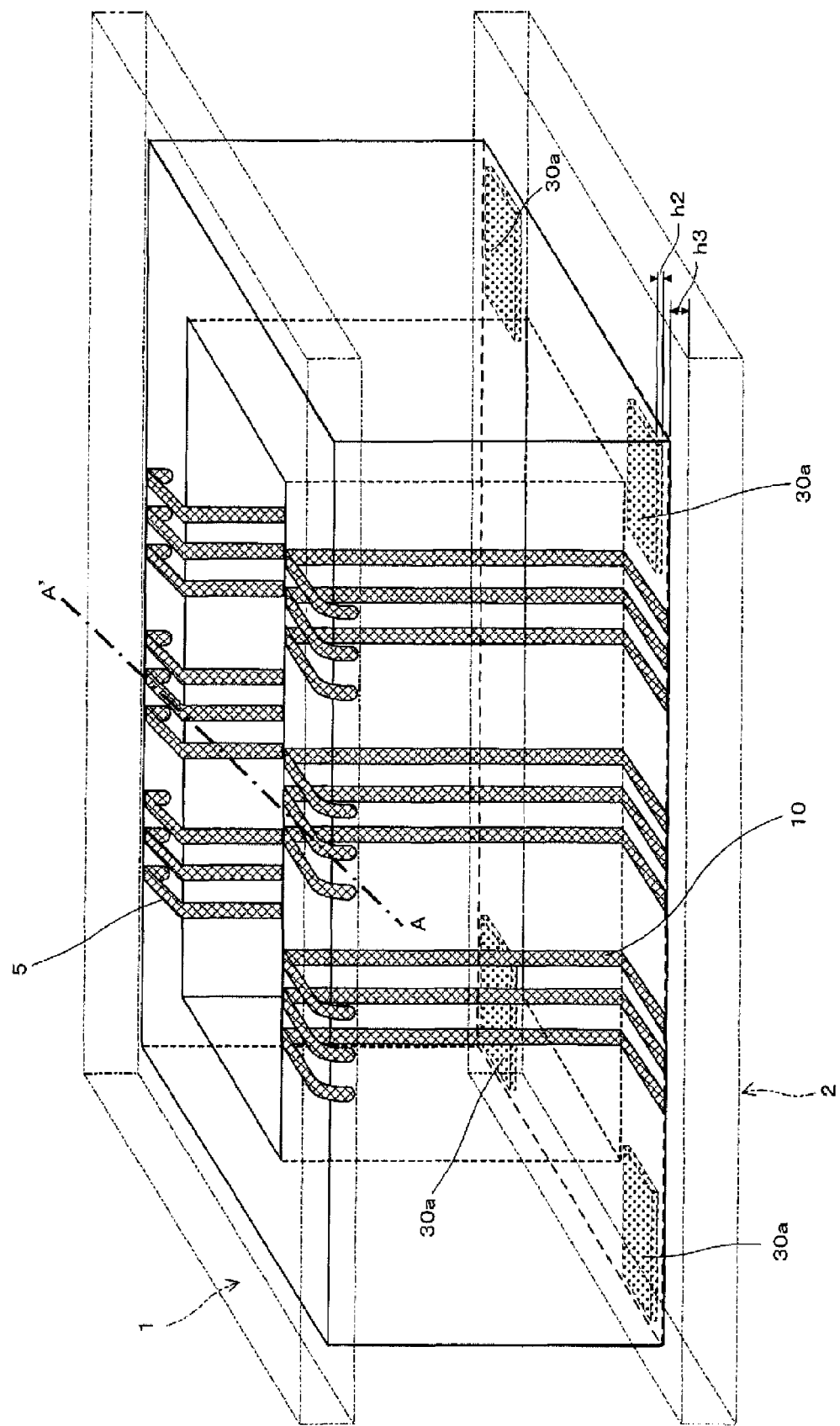
FIG. 19 is a schematic perspective view of a three-dimensional wiring structure according to (Embodiment 11) of the present invention.

FIG. 19 shows (Embodiment 11) of the present invention.

In the description below, the same components as those in FIGS. 13 and 14 are denoted by the same reference numerals.

In the interconnecting board 3 in accordance with (Embodiment 9), shown in FIG. 13, the elastic member 30 is formed between the interconnecting board main body 3a and the second circuit board 2-side parts of the circuit board connecting wires 10. However, in the interconnecting board 3 in FIG. 19, an elastic member 30a that is as elastic as the elastic member 30 is mounted in the four corners of the interconnecting board main body 3a; the corners are located in areas which are located on the surfaces of the interconnecting board main body 3a lying opposite the first and second circuit boards 1 and 2 and in which the circuit board connecting wires 10 are not formed. Preferably, the thickness h2 of the elastic member 30a is smaller than the gap h3 between the interconnecting board main body 3a and the second circuit board 2, that is, h2<h3.

In FIG. 19, the elastic members 30a are provided on the second circuit board 2-side. However, similar effects are exerted by providing the elastic members 30a on the first circuit board 1 side of the interconnecting board main body 3a.

The elastic members 30a thus provided on the interconnecting board 3 serve to easily absorb impact stress caused by a possible thermal shock or falling impact or the deforming force of the circuit board, resulting in improved reliability.

With the three-dimensional wiring structure constructed by connecting the first circuit board 1 and the second circuit board 2 together via the interconnecting board 3, similar effects are expected to be exerted by mounting the elastic members 30a on the second circuit board 2-side instead of the interconnecting board main body 3a side in the areas which are located on the surfaces of the interconnecting board main body 3a lying opposite the first and second circuit boards 1 and 2 and in which the circuit board connecting wires 10 are not formed. Similar effects are also expected to be exerted by mounting the elastic members 30a on the first circuit board 1-side.

Embodiment 12

Figure 20:
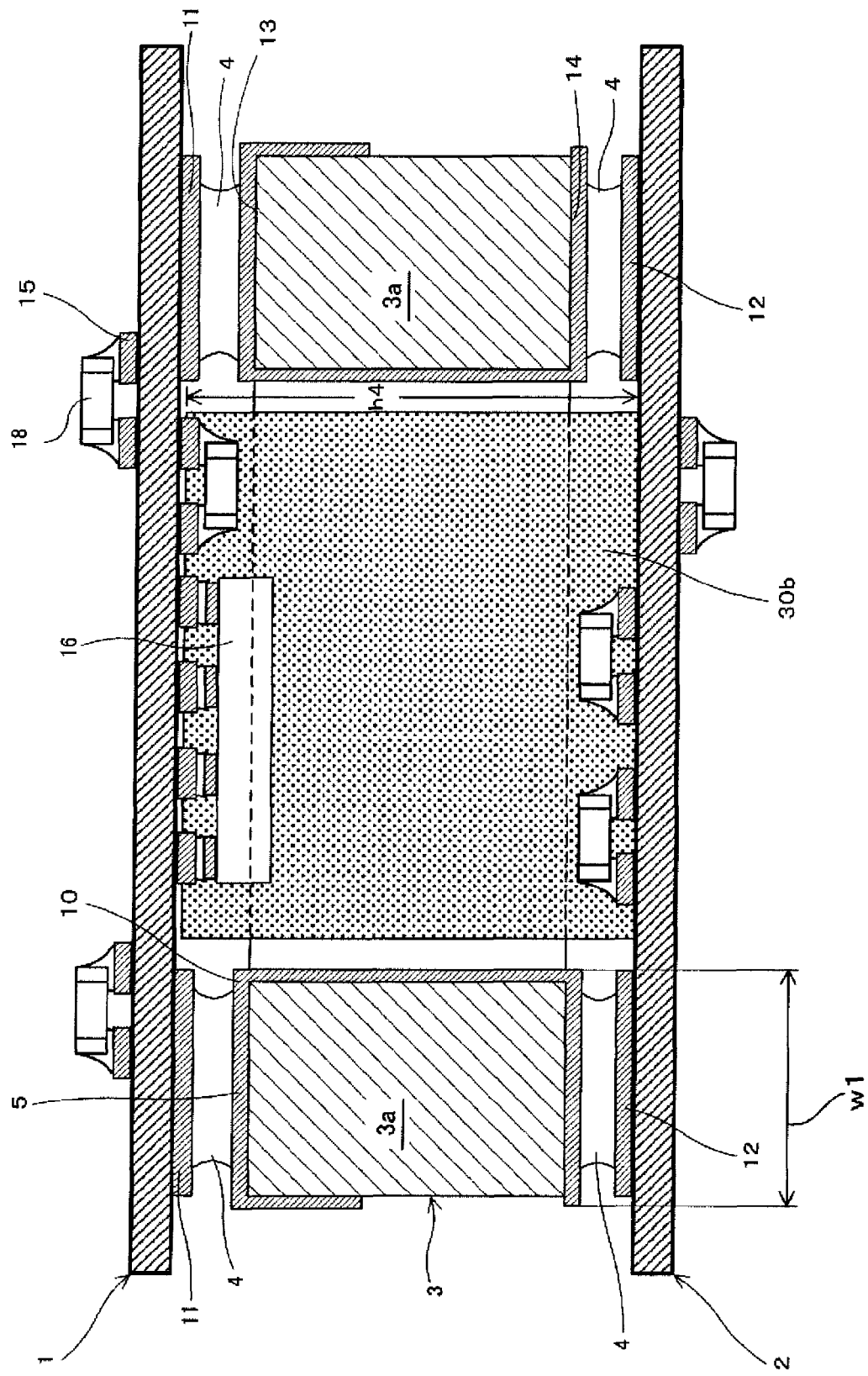
FIG. 20 is a schematic sectional view of a three-dimensional wiring structure according to (Embodiment 12) of the present invention.
Figure 21:
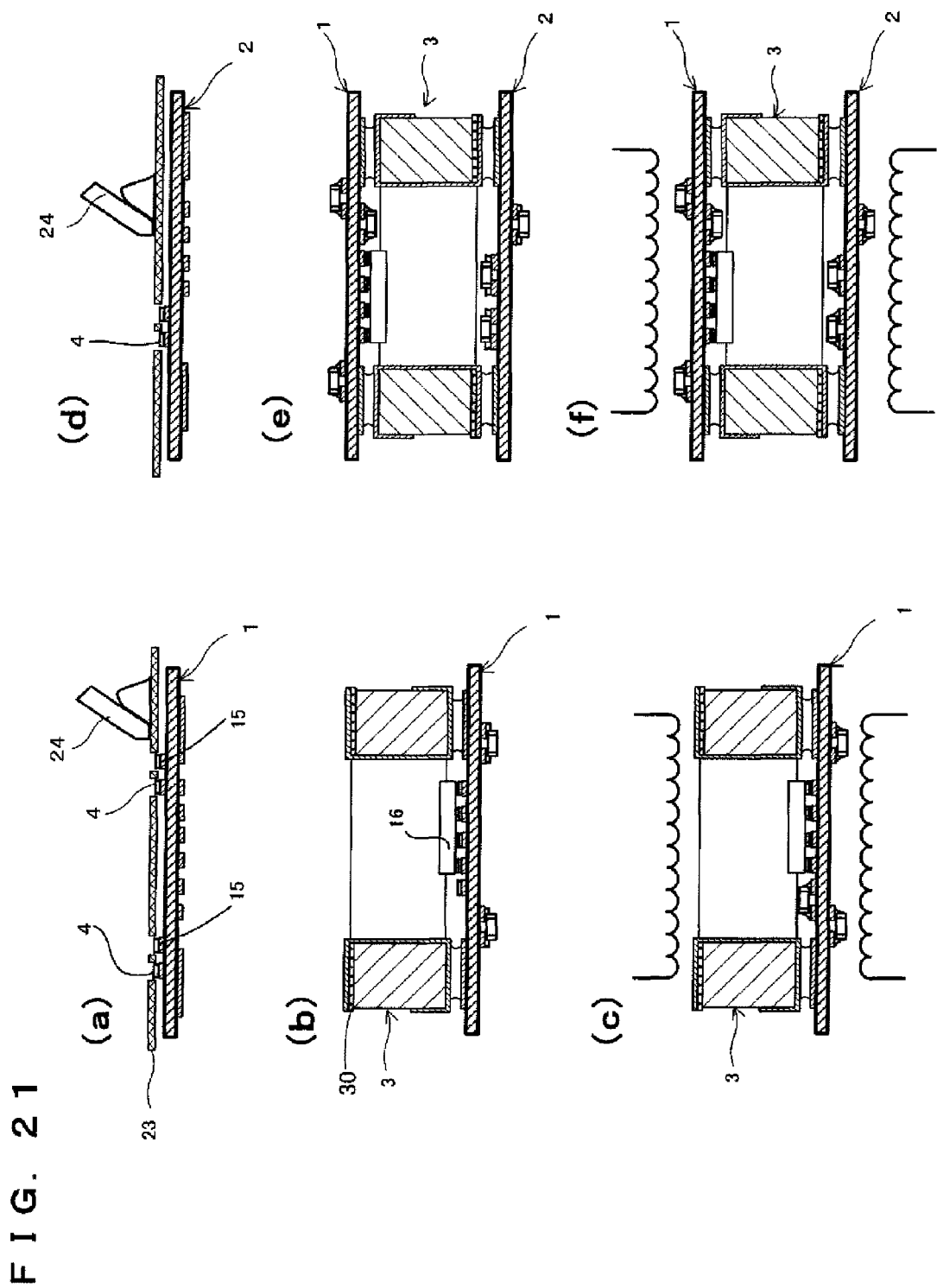
FIG. 21 is a process diagram of manufacturing a three-dimensional wiring structure according to (Embodiment 13) of the present invention.
Figure 22:
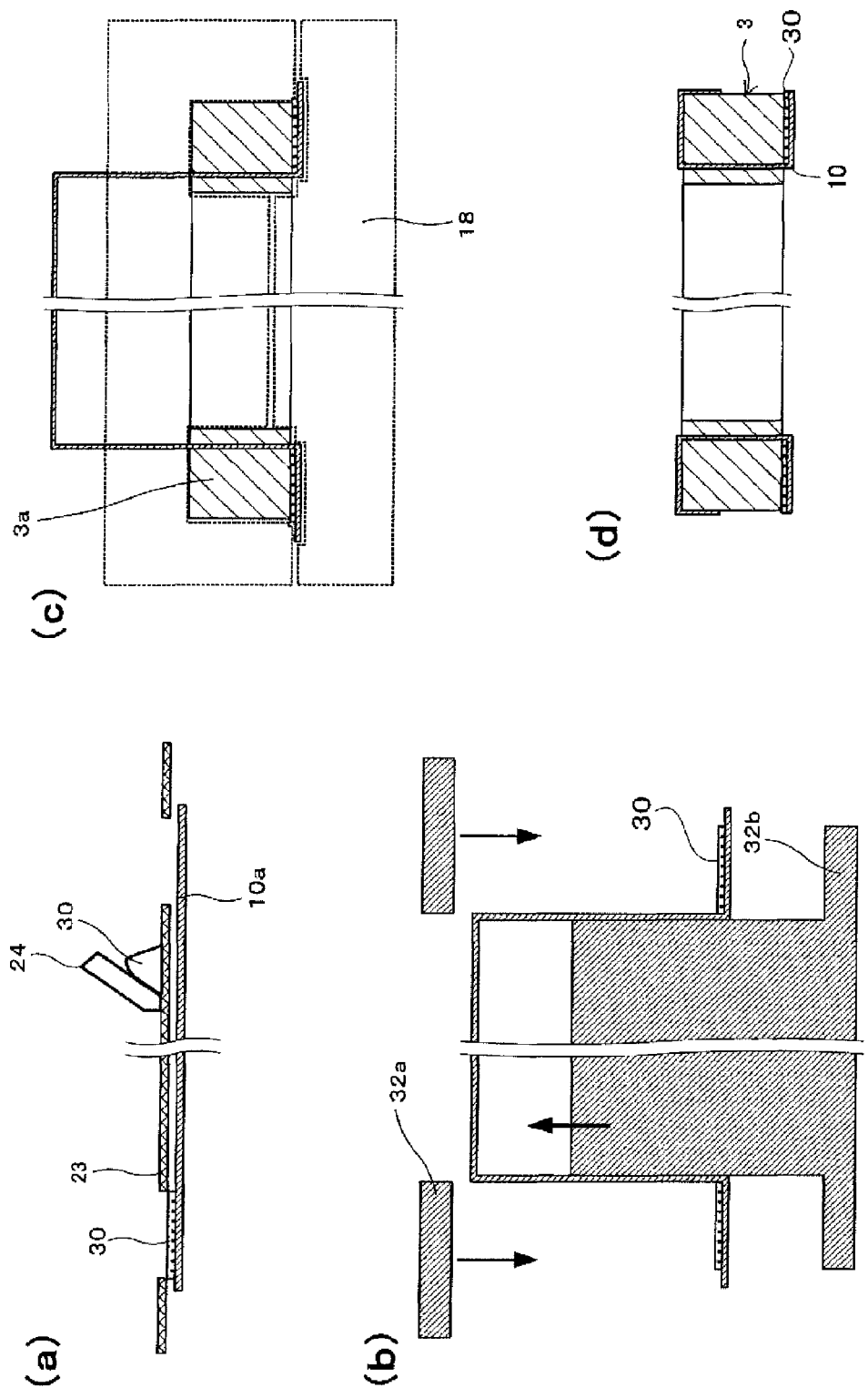
FIG. 22 is a process diagram of manufacturing an interconnecting board according to (Embodiment 14) of the present invention.
Figure 23:
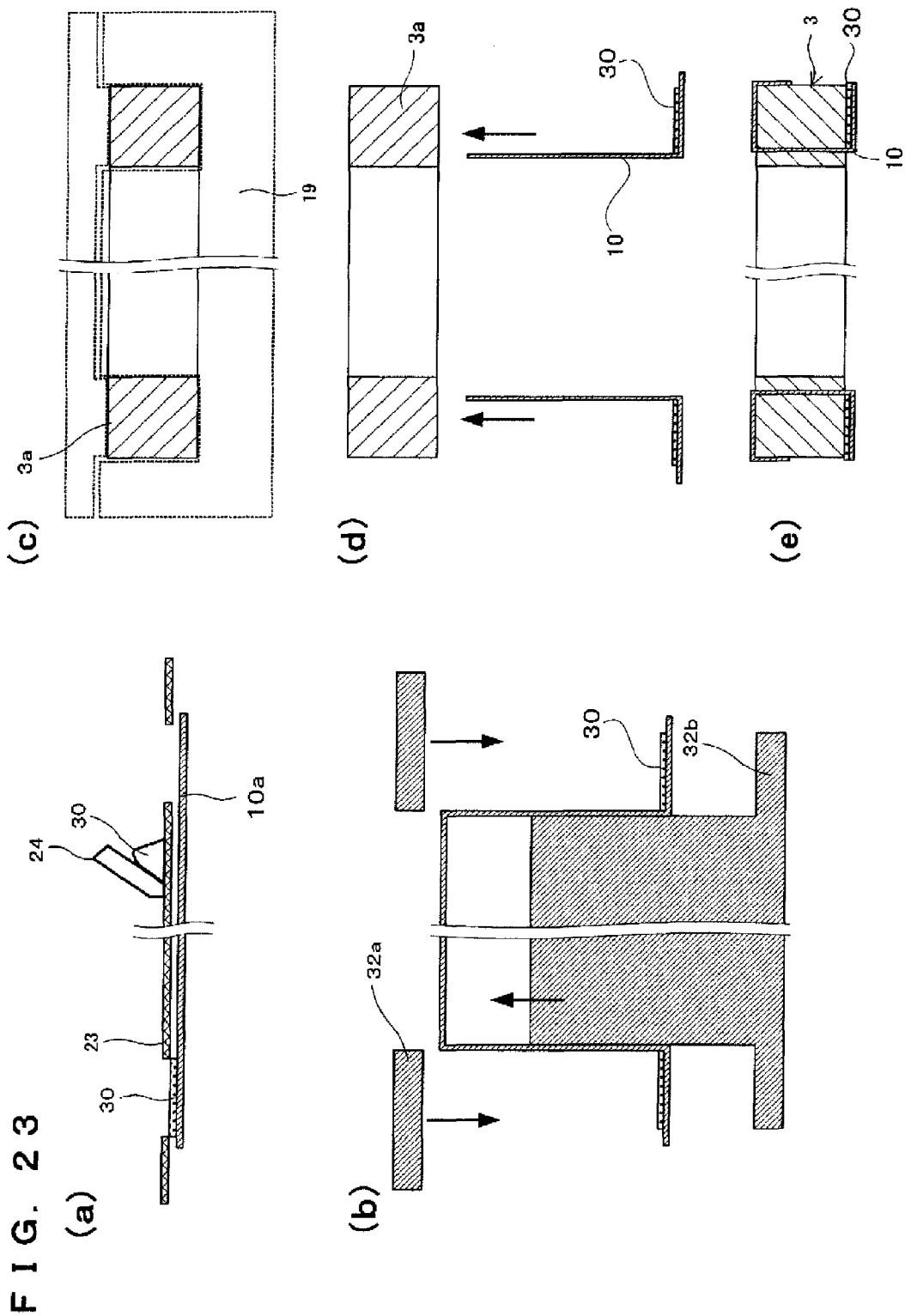
FIG. 23 is a process diagram of manufacturing an interconnecting board according to (Embodiment 15) of the present invention.

FIG. 20 shows (Embodiment 12) of the present invention.

In the description below, the same components as those in FIGS. 13 to 19 are denoted by the same reference numerals.

In the above embodiments, the elastic member 30 is provided between the interconnecting board main body 3a and the circuit board connecting wires 10 as shown in FIGS. 13 and 16 or the elastic members 30a are provided between the interconnecting board 3 and the first or second circuit board 1 or 2 as shown in FIG. 19. However, in FIG. 20, an elastic member 30b is provided in the through-slot 3c in the interconnecting board 3 and in the gap portion between the first circuit board 1 and the second circuit board 2; the elastic member 30b has a thickness h4 smaller than that of the circuit board gap. The elastic member 30b may be provided either on the first circuit board 1 or on the second circuit board 2. In FIG. 20, the elastic member 30b is mounted on the second circuit board 2.

In this configuration, the elastic member corresponds to the gap portion between the first and second circuit boards 1 and 2 except for the connection portion of the interconnecting board 3, and has the thickness smaller than the circuit board gap. This allows the elastic member to absorb stress generated when a central portion of the interconnecting board, which tends to be significantly deformed, is bent. This in turn improves reliability against impact stress resulting from a possible thermal shock or falling impact or the deformation of the circuit board.

In the above embodiments of the present invention, the rectangular interconnecting board and the first circuit board and second circuit board are arranged on the upper and lower surfaces, respectively, of the interconnecting board. However, the present invention is not limited to this. The first circuit board and the second circuit board may be interconnected by, for example, a substantially L-shaped, triangular, or circular interconnecting board.

Embodiment 13

FIGS. 21(a) to 21(f) show a method of manufacturing the three-dimensional wiring structure shown in FIG. 13.

First, the metal plate 23 and the squeegee 24 are used to form, by printing or the like, the junction layer 4 on the desired terminal electrodes 15 on the first circuit board 1 on which the electronic component 16 and the interconnecting board 3 are to be mounted (FIG. 21(a)). The junction layer 4 may be formed by plating, dispensing, or the like instead of the printing (printing is performed using the metal plate 23 or a screen).

Then, the electronic component 16 and the interconnecting board 3 are aligned and then placed on the first circuit board 1 with the junction layer 4 formed thereon. At this time, if the electronic component 16 is mounted on both surfaces of the first circuit board 1, the electronic component 16 is placed on an upper (front) side of the first circuit board 1, the first circuit board 1 is then reversed, and the electronic component 16 and the interconnecting board 3 are placed on a lower (back) side of the first circuit board (FIG. 21(b)).

The first circuit board 1 with the electronic component 16 and the annular interconnecting board 3 placed thereon is then subjected to the thermal process such as reflow or in the curing oven to melt or cure the junction layer 4 to electrically join the first circuit board 1 to the electronic component 16 and the interconnecting board 3 (FIG. 21(c)). Alternatively, the thermal process may be executed on each of the front and back surfaces for combination.

The metal plate 23 and the squeegee 24 are used to form, by printing or the like, the junction layer 4 on the desired terminal electrodes 15 on which the electronic component 16 and the interconnecting board 3 of the second circuit board 2 are to be mounted (FIG. 21(d)).

The electronic components 15 and the first circuit board 1 with the interconnecting board 3 are then aligned and placed on the second circuit board 2 with the junction layer 4 formed thereon. At this time, if the electronic component 16 is mounted on both surfaces of the second circuit board 2, the electronic component 16 is placed on the upper (front) side of the second circuit board 2, the second circuit board 2 is then reversed, and the first circuit board 1 with the electronic component 16 and the interconnecting board 3 is placed on the lower (back) side of the second circuit board 2 (FIG. 21(e)). Also in this case, the back side may be subjected to the thermal process before the front side.

Finally, the second circuit board 2 with the first circuit board 1 with the electronic component 15 and the interconnecting board 3 placed thereon is then subjected to the thermal process such as reflow or in the curing oven to melt or cure the junction layer 4 to electrically join the second circuit board 2 to the first circuit board 1 with the electronic component 16 and the interconnecting board 3 (FIG. 21(f)).

This manufacturing method provides the first circuit board and the second circuit board in the form of separate module circuit boards before connecting the circuit boards together. This allows each module circuit board to be easily inspected for properties.

Embodiment 14

FIGS. 22(a) to 22(d) show a method of manufacturing the interconnecting board 3 shown in FIG. 16.

Reference numerals 27a and 27b denote thin plate working jigs, and reference numeral 18 denotes the first mold. The thin plate working jigs and the first mold are shown by dotted lines.

First, the metal plate 23 is set on a circuit board connecting wiring board 10a, and a liquid elastic member 30 is applied to and thus printed on the circuit board connecting wiring board 10a using the squeegee 24 or the like so as to be formed into a solid. An alternative method of forming the elastic member 30 may be dispensing or another batch printing. The printed elastic member is thermally or optically cured (FIG. 22(a)).

The circuit board connecting wiring board 10a with the elastic member 30 formed thereon is then subjected to thin plate working by pressing the circuit board connecting wiring board 10a into a desired molding shape by means of the thin plate working jigs 32a and 32b (FIG. 22(b)).

The circuit board connecting wiring board 10a of the desired molding shape is then molded into a three-dimensional molded article by using the first mold 18 and injection-molding a first insulting resin forming the interconnecting board main body 3a (FIG. 22(c)).

Folding portions at tips of the circuit board connecting wires 10 are then cut into a desired length and then subjected to molding or press fitting. Unwanted parts of the circuit board connecting wires are further cut off (FIG. 22(d)).

With this manufacturing method, the elastic member 30 is provided between at least one of the sets of the circuit board connecting wires provided on the interconnecting board main body 3a and the interconnecting board main body 3a. This makes it possible to easily absorb impact stress caused by a possible thermal shock or falling impact, resulting in improved reliability.

The relationship between interconnecting board molding temperature and the heat resistance of the elastic member is such that the elastic member can be prevented from being thermally degraded or deformed by setting the maximum temperature that can be resisted by the elastic member to be higher than the interconnecting board molding temperature, resulting in improved reliability.

Embodiment 15

FIGS. 23(a) to 23(e) show a method of manufacturing the interconnecting board 3 shown in FIG. 16.

Reference numerals 27a and 27b denote the thin plate working jigs, and reference numeral 19 denotes the second mold. The thin plate working jigs and the first mold are shown by dotted lines.

First, the metal plate 23 is set on the circuit board connecting wiring board 10a, and the liquid elastic member 30 is applied to and thus printed on the circuit board connecting wiring board 10a using the squeegee 24 or the like so as to be formed into a solid. An alternative method of forming the elastic member 30 may be dispensing or another batch printing. The printed elastic member is thermally or optically cured (FIG. 23(a)).

The circuit board connecting wiring board 10a with the elastic member 30 formed thereon is then set on the thin plate working jigs 32a and 32b and subjected to thin plate working so as to have a desired molding shape (FIG. 23(b)).

A liquid first resin forming the interconnecting board main body 3a is poured into the second mold 19 having the desired molding shape. The second mold 19 is covered with another mold (FIG. 23(c)). Performing vacuum degassing before covering with the mold enables the manufacture of an interconnecting board free from voids.

In this case, the first resin is cured at room temperature or a low temperature of about 150° C. However, the first resin may be of a UV curing type, which allows for curing of the resin in a shorter time period. A material for the molds is preferably glass or resin offering higher light transmittance if photo curing is used.

The circuit board connecting wiring board 10a subjected to the thin plate working in FIG. 23(b) is pressed into the interconnecting board main body 3a produced in FIG. 23(c) using a press machine or the like (FIG. 23(d)).

A tip portion of the pressed-in circuit board connecting wiring board 10a is folded, and unwanted parts of circuit board connecting wiring leads are cut (FIG. 23(e)).

With this manufacturing method, the elastic member is provided between at least one of the sets of the circuit board connecting wires provided on the interconnecting board main body and the interconnecting board main body. This makes it possible to easily absorb impact stress caused by a possible thermal shock or falling impact, resulting in improved reliability.

The manufacturing method eliminates the need for expensive injection-molding molds, reducing manufacturing costs.

Embodiment 16

Figure 24:
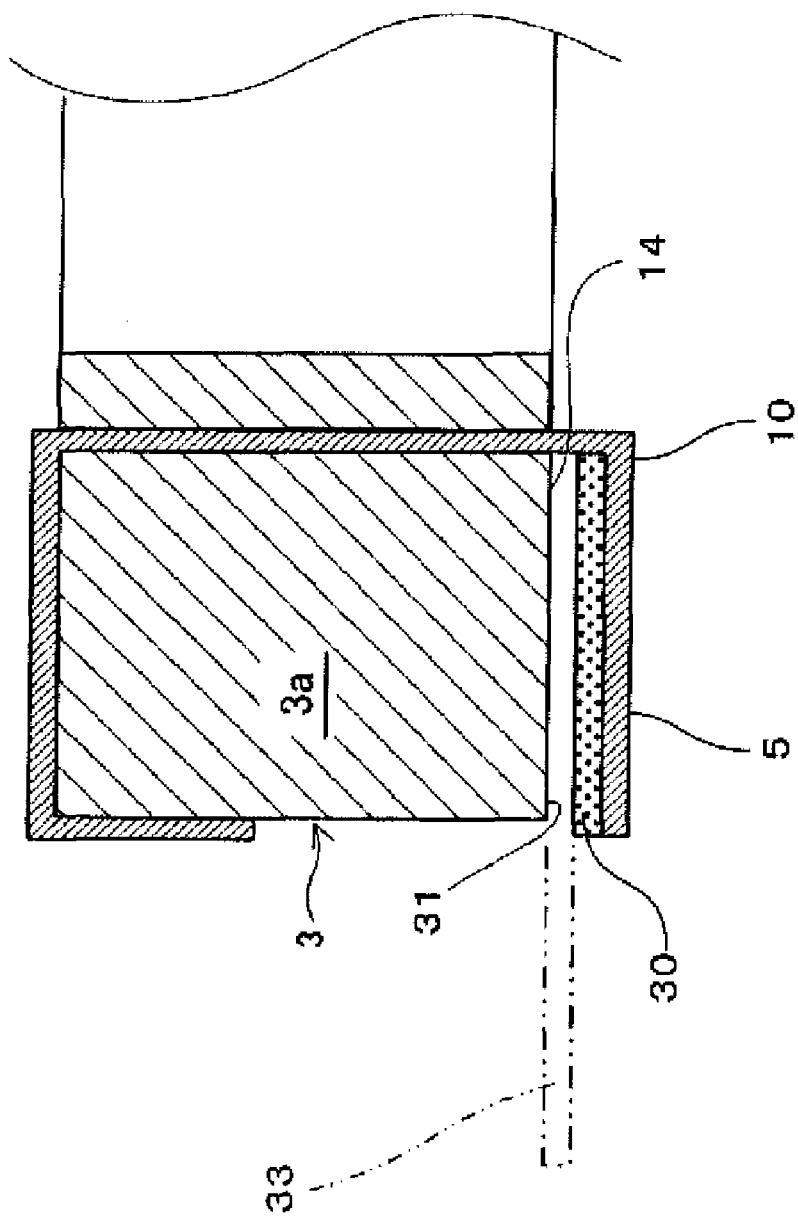
FIG. 24 is a process diagram of manufacturing an interconnecting board according to (Embodiment 16) of the present invention.
Figure 25:
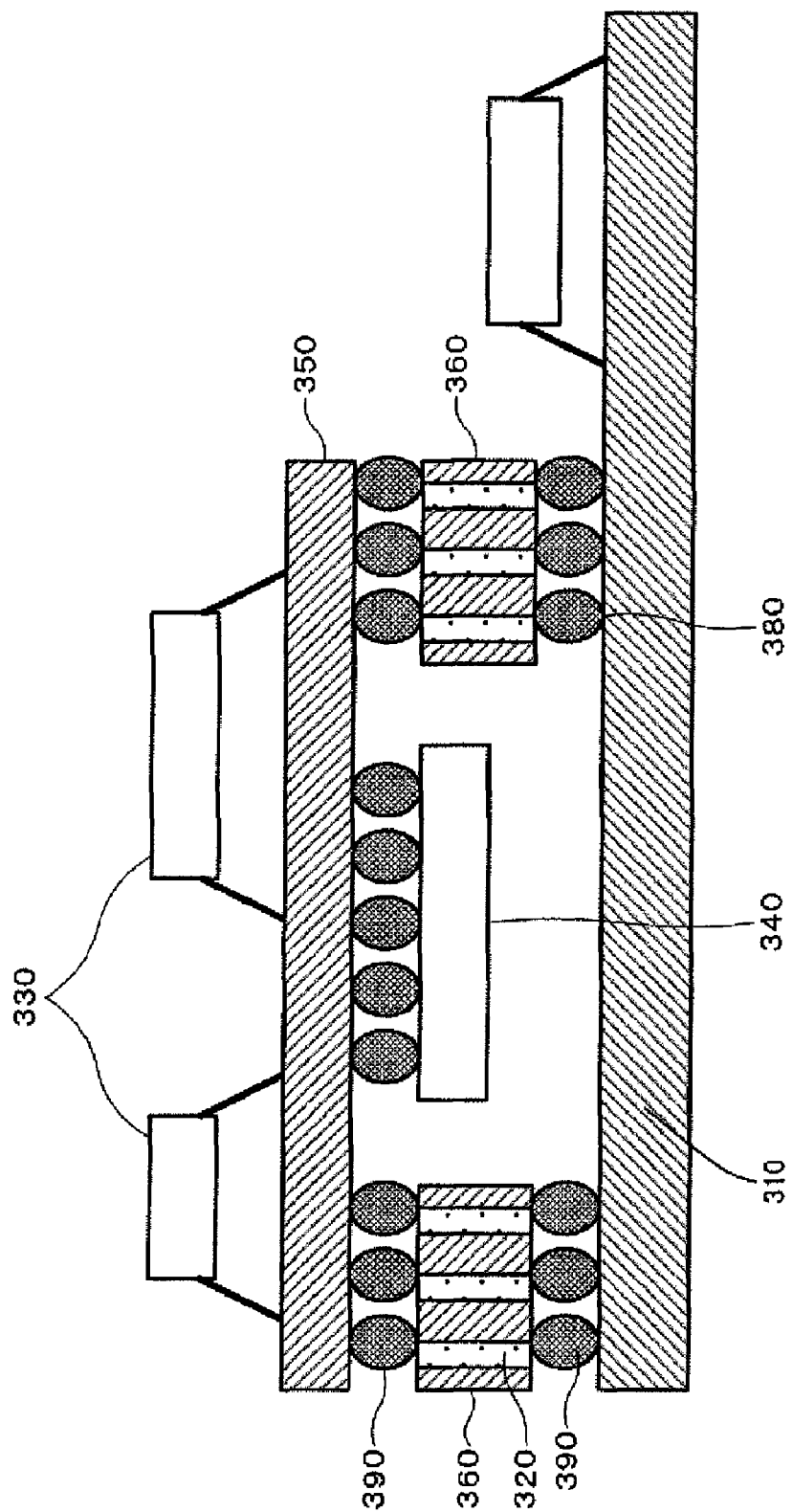
FIG. 25 is a sectional view of an electric circuit device in (Patent Document 1)
Figure 26:
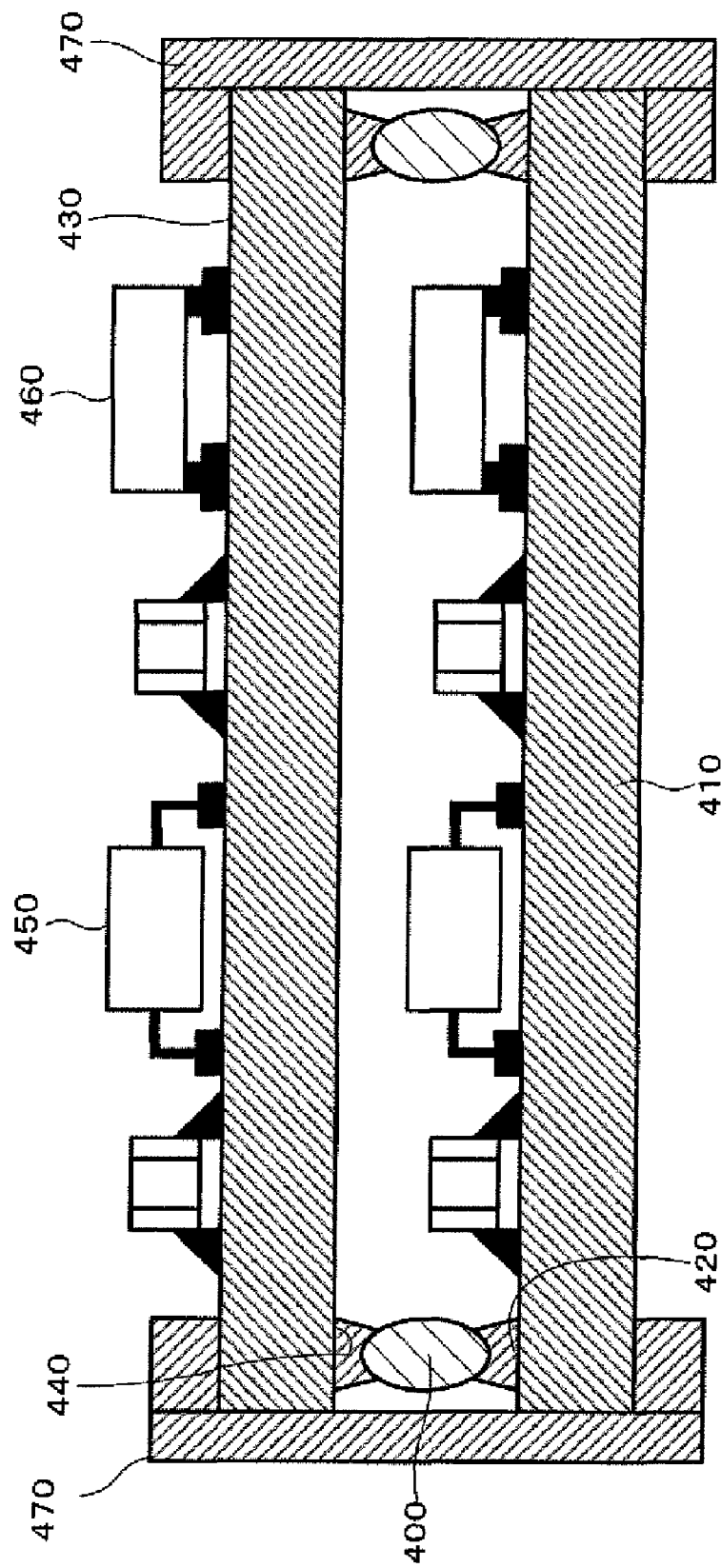
FIG. 26 is a sectional view of an electric circuit device in (Patent Document 2)
Figure 27:
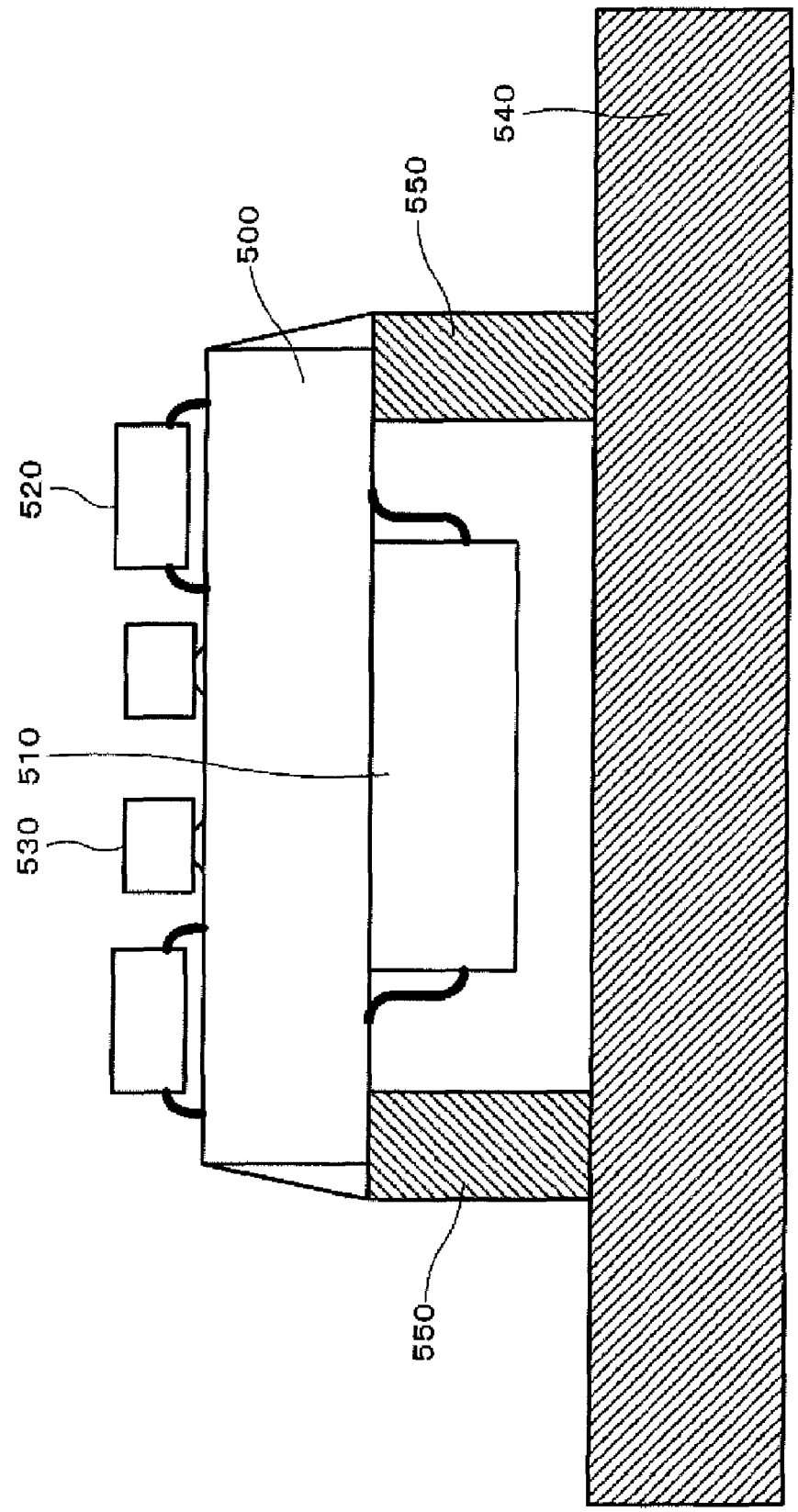
FIG. 27 is a sectional view of an electric circuit device in (Patent Document 3)
Figure 30:
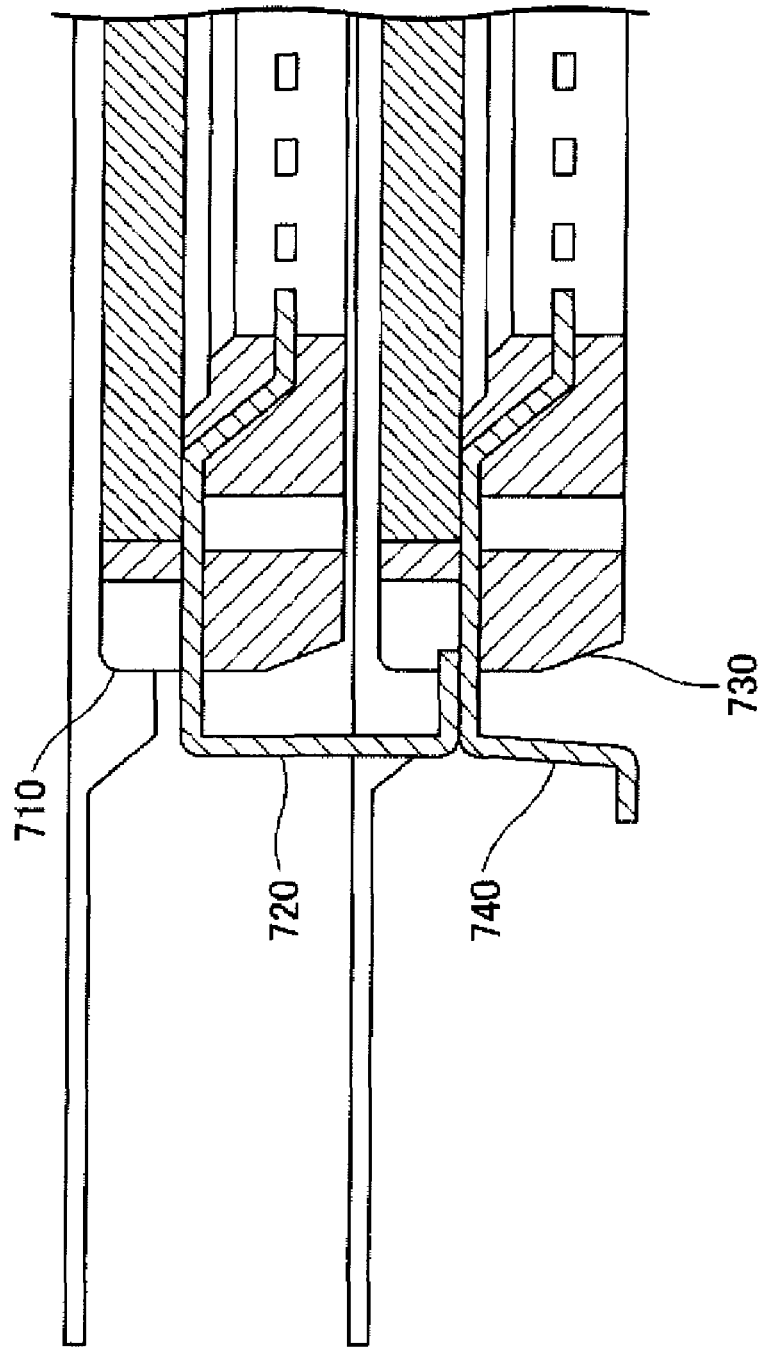
FIG. 30 is a sectional view of an electric circuit device in (Patent Document 6)
Figure 31:
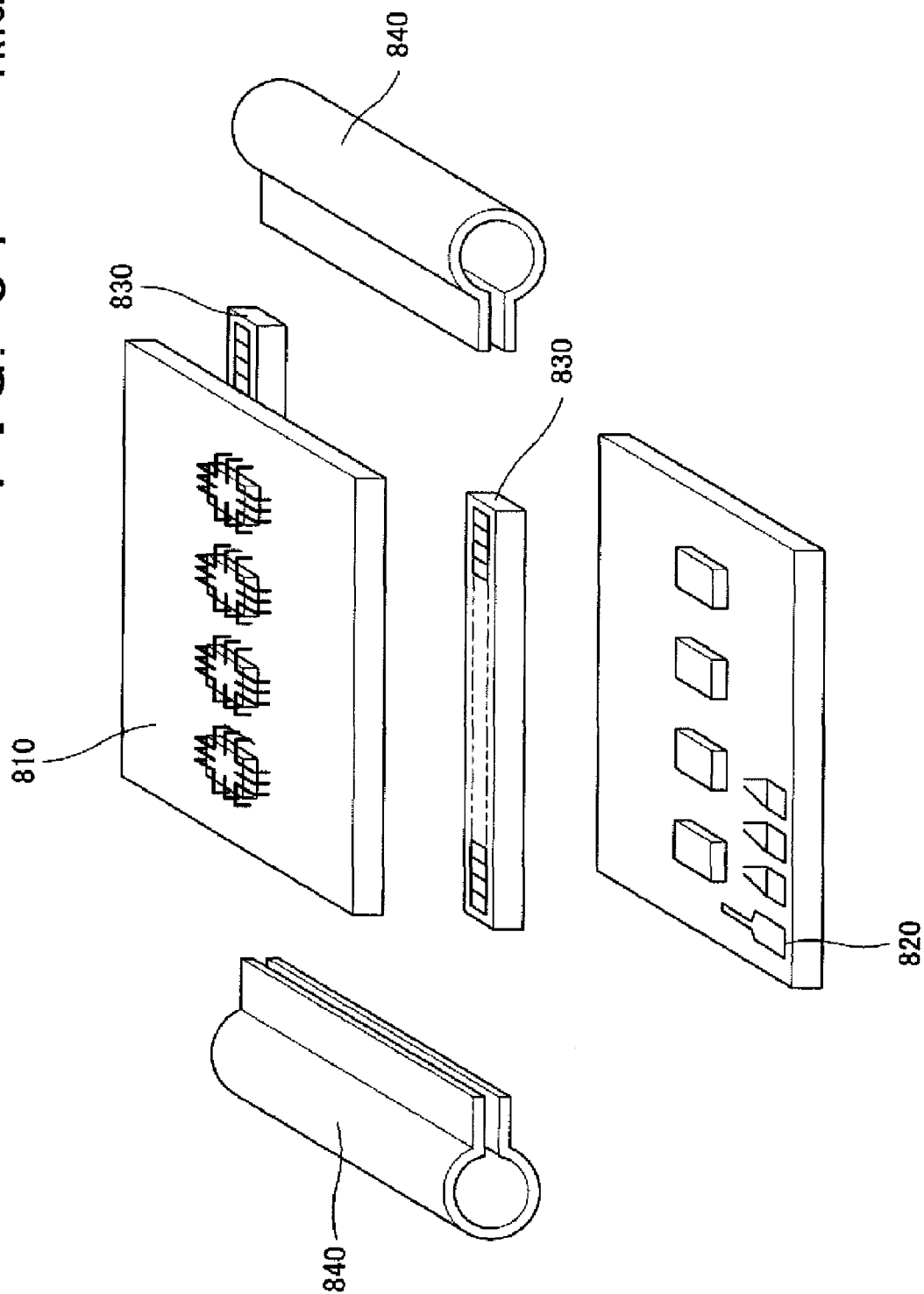
FIG. 31 is a sectional view of an electric circuit device in (Patent Document 7).

FIG. 24 shows a process of manufacturing the interconnecting board 3 shown in FIG. 17.

In FIG. 24, reference numeral 28 denotes a spacer jig shown by a dotted line.

A step shown in FIG. 24 is executed during the step shown in FIG. 22(c) or the step shown in FIG. 23(c) and involves inserting or temporarily inserting the spacer jig 33 between the interconnecting board main body 3a and the circuit board connecting wires 10 with the elastic member 30 formed thereon and then removing the spacer jig 33 to form the gap 31.

With this manufacturing method, the elastic member 30 and the gap 31 are provided between at least one of the sets of the circuit board connecting wires provided on the interconnecting board main body and the interconnecting board main body. This provides the relaxing mechanism based on the spring properties to allow impact stress caused by a possible thermal shock or falling impact to be more easily absorbed. This in turn results in further improved reliability.

The interconnecting board 3 shown in FIG. 17 or 18 can be molded using the spacer jig 33.

In the above embodiments, the interconnecting board 3 is shaped to have the through-slot 3c in the center thereof. However, in the embodiments other than (Embodiment 12), the through-slot 3c may be omitted from the interconnecting board 3. Specifically, instead of the through-slot 3c, a recessed portion may be formed in the interconnecting board 3 so as to extend to the middle thereof, with an electronic component mounted in the recessed portion.

Of course, the embodiments of the present invention described above may be applied to one another, and the present invention is not limited to these embodiments.

INDUSTRIAL APPLICATION

The three-dimensional wiring structure in accordance with the present invention is the three-dimensional connecting structure that connects the first circuit board and the second circuit board together via the interconnecting board. The three-dimensional wiring structure enables the junction between the circuit boards and dense mounting. The three-dimensional wiring structure is thus widely applicable to various mobile apparatuses such as cellular phones which are desired to be compact and to provide multiple advanced functions as well as portable terminal apparatuses such as a slave apparatus for a door remote controller for an automobile or the like.

The invention claimed is:

1. An interconnecting board to be interposed between a first circuit board and a second circuit board comprising:
   an interconnecting board main body to be interposed between a first circuit board and a second circuit board; and
   circuit board connecting wiring formed in association with electric connection points so as to extend from a first circuit board-side surface of the interconnecting board main body to a second circuit board-side surface of the interconnecting board main body,
   wherein a recessed portion is formed in at least one of a corner portion extending continuously from a top surface to a side surface portion of the interconnecting board main body and a corner portion extending continuously from a bottom surface to the side surface portion of the interconnecting board main body, the circuit board connecting wiring is formed along the recessed portion, a corner portion processing material is filled into the recessed portion, and a corner portion of the circuit board connecting wiring is buried in the corner portion processing material.

2. A three-dimensional wiring structure comprising:
   a first circuit board;
   a second circuit board; and
   the interconnecting board according to claim 1,
   wherein the first circuit board and the second circuit board are three-dimensionally connected together by interposing the interconnecting board.

3. An interconnecting board to be interposed between a first circuit board and a second circuit board comprising:
   an interconnecting board main body to be interposed between a first circuit board and a second circuit board; and
   circuit board connecting wiring formed in association with electric connection points so as to extend from a first circuit board-side surface of the interconnecting board main body to a second circuit board-side surface of the interconnecting board main body,
   wherein the interconnecting board main body has a corner portion extending continuously from the first circuit board-side surface to a side surface portion and a corner portion extending continuously from the second circuit board-side surface to the side surface portion, at least one of the corner portions being formed into an inclined surface including a corrugated curved surface, the ends and corner portion of the circuit board connecting wiring being stuck along the inclined surface including the corrugated curved surface.

4. A three-dimensional wiring structure comprising:
   a first circuit board;
   a second circuit board; and
   the interconnecting board according to claim 3,
   wherein the first circuit board and the second circuit board are three-dimensionally connected together via the interconnecting board.

5. An interconnecting board to be interposed between a first circuit board and a second circuit board comprising:
   an interconnecting board main body to be interposed between a first circuit board and a second circuit board;
   circuit board connecting wiring formed on the interconnecting board main body in association with electric connection points so as to connect a first circuit board-side surface of the interconnecting board main body to a second circuit board-side surface of the interconnecting board main body; and
   an elastic member formed on at least one of an area between the circuit board connecting wiring and the first circuit board-side surface of the interconnecting board main body and an area between the circuit board connecting wiring and a second circuit board-side surface of the interconnecting board main body.

6. The interconnecting board according to claim 5, wherein a gap is formed in one of an area between the interconnecting board main body and the elastic member and an area between the circuit board connecting wiring and the elastic member.

7. A three-dimensional wiring structure comprising a first circuit board and a second circuit board three-dimensionally connected together via the interconnecting board according to claim 5 between the first circuit board and the second circuit board.

8. An interconnecting board to be interposed between a first circuit board and a second circuit board comprising:

an interconnecting board main body to be interposed between a first circuit board and a second circuit board;

circuit board connecting wiring formed on the interconnecting board main body in association with electric connection points so as to connect a first circuit board-side surface of the interconnecting board main body to a second circuit board-side surface of the interconnecting board main body; and an elastic member mounted on the interconnecting board main body in an area of a surface of the interconnecting board main body located opposite each of the first and second circuit boards on which area the circuit board connecting wiring is not formed.

\* \* \* \* \*